(12) United States Patent
Moffitt et al.

(10) Patent No.: US 8,961,239 B2
(45) Date of Patent: Feb. 24, 2015

(54) COMMUNICATION JACK HAVING A PLURALITY OF CONTACTS MOUNTED ON A FLEXIBLE PRINTED CIRCUIT BOARD

(71) Applicant: CommScope, Inc. of North Carolina, Hickory, NC (US)

(72) Inventors: Bryan S. Moffitt, Red Bank, NJ (US); Yi-Teh Shih, Richardson, TX (US); Daniel Bertoncini, Allen, TX (US); Chen-Chien Lin

(73) Assignee: CommScope, Inc. of North Carolina, Hickory, NC (US)

( * ) Notice: Subject to any disclaimer, the term of this patent is extended or adjusted under 35 U.S.C. 154(b) by 4 days.

(21) Appl. No.: 13/803,660

(22) Filed: Mar. 14, 2013

(65) Prior Publication Data

US 2014/0073198 A1 Mar. 13, 2014

Related U.S. Application Data

(60) Provisional application No. 61/697,955, filed on Sep. 7, 2012, provisional application No. 61/699,903, filed on Sep. 12, 2012.

(51) Int. Cl.
*H01R 24/00* (2011.01)
*H01R 13/6461* (2011.01)
(Continued)

(52) U.S. Cl.
CPC ........ *H01R 13/6461* (2013.01); *H01R 13/6466* (2013.01); *H01R 13/6469* (2013.01); *H01R 24/64* (2013.01); *H05K 1/0228* (2013.01);
(Continued)

(58) Field of Classification Search
CPC ............ H01R 23/005; H01R 13/6625; H01R 23/6658
USPC ............................................. 439/676, 620.22
See application file for complete search history.

(56) References Cited

U.S. PATENT DOCUMENTS

| 6,017,247 A | 1/2000 | Gwiazdowski |
| 6,428,362 B1 | 8/2002 | Phommachanh |

(Continued)

FOREIGN PATENT DOCUMENTS

| CA | 2 464 834 A1 | 10/2005 |
| DE | 10 2007 00959 A1 | 8/2008 |
| FR | 2 919 434 A1 | 1/2009 |

OTHER PUBLICATIONS

Notification of Transmittal of the International Search Report and the Written Opinion of the International Searching Authority, or the Declaration, Application No. PCT/US2013/057965, dated Dec. 9, 2013, 12 pages.

*Primary Examiner* — Chandrika Prasad
(74) *Attorney, Agent, or Firm* — Myers Bigel Sibley & Sajovec, P.A.

(57) ABSTRACT

Communications jacks include a housing having a plug aperture in a front portion thereof and a flexible printed circuit board having a plurality of conductive paths thereon. A plurality of input contacts and a plurality of output contacts are each electrically connected to respective ones of the conductive paths on the flexible printed circuit board. A spring that is separate from the input contacts is connected to at least a first of the input contacts. Each of the input contacts comprises a separate, raised contact that is connected to the flexible printed circuit board and mounted to extend into the plug aperture.

19 Claims, 15 Drawing Sheets

(51) Int. Cl.
*H01R 13/6466* (2011.01)
*H01R 13/6469* (2011.01)
*H01R 24/64* (2011.01)
*H05K 1/02* (2006.01)
*H05K 1/14* (2006.01)
*H05K 1/16* (2006.01)

(52) U.S. Cl.
CPC .............. *H05K1/0239* (2013.01); *H05K 1/147* (2013.01); *H05K 1/162* (2013.01); *H05K 2201/10189* (2013.01)
USPC ........................................................ 439/676

(56) References Cited

U.S. PATENT DOCUMENTS

| | | | |
|---|---|---|---|
| 6,464,541 B1 | 10/2002 | Hashim et al. | |
| 6,641,443 B1 | 11/2003 | Itano et al. | |
| 7,179,131 B2 | 2/2007 | Caveney et al. | |
| 7,252,554 B2 | 8/2007 | Caveney et al. | |
| 7,264,516 B2 | 9/2007 | Hashim et al. | |
| 7,281,957 B2* | 10/2007 | Caveney | 439/676 |
| 7,326,089 B2 | 2/2008 | Hashim | |
| 7,442,092 B2 | 10/2008 | Caveney et al. | |
| 7,601,034 B1 | 10/2009 | Aekins et al. | |
| 7,670,193 B2 | 3/2010 | Milette et al. | |
| 7,682,203 B1 | 3/2010 | Pharney et al. | |
| 7,824,231 B2 | 11/2010 | Marti et al. | |
| 7,837,513 B2 | 11/2010 | Millette et al. | |
| 7,850,492 B1 | 12/2010 | Straka et al. | |
| 7,976,348 B2 | 7/2011 | Aekins et al. | |
| 8,011,972 B2* | 9/2011 | Caveney et al. | 439/676 |
| 8,083,551 B2* | 12/2011 | Hetzer et al. | 439/676 |
| 8,435,083 B2* | 5/2013 | Hetzer et al. | 439/676 |
| 2003/0232517 A1 | 12/2003 | Liu et al. | |
| 2005/0202697 A1 | 9/2005 | Caveney et al. | |
| 2007/0190863 A1 | 8/2007 | Caveney et al. | |
| 2007/0259571 A1 | 11/2007 | Chen | |
| 2008/0132123 A1* | 6/2008 | Milette et al. | 439/676 |
| 2010/0124855 A1 | 5/2010 | Milette et al. | |
| 2010/0190357 A1 | 7/2010 | Hashim | |
| 2010/0203763 A1* | 8/2010 | Hetzer et al. | 439/620.22 |
| 2010/0317230 A1* | 12/2010 | Larsen et al. | 439/620.22 |
| 2011/0065322 A1 | 3/2011 | Milette et al. | |
| 2011/0124219 A1 | 5/2011 | Milette et al. | |
| 2012/0156932 A1 | 6/2012 | Straka et al. | |
| 2012/0164884 A1* | 6/2012 | Hetzer et al. | 439/620.22 |
| 2012/0244752 A1 | 9/2012 | Patel et al. | |

* cited by examiner

COMMUNICATION JACK HAVING A PLURALITY OF CONTACTS MOUNTED ON A FLEXIBLE PRINTED CIRCUIT BOARD

CROSS-REFERENCE TO RELATED APPLICATIONS

The present application claims priority under 35 U.S.C. §119(e) from U.S. Provisional Patent Application Ser. No. 61/699,903, filed Sep. 12, 2012 and to U.S. Provisional Patent Application Ser. No. 61/697,955, filed Sep. 7, 2012, the disclosure of each of which is hereby incorporated herein by reference in its entirety.

FIELD OF THE INVENTION

The present invention relates generally to communications connectors and, more particularly, to communications jacks.

BACKGROUND

Computers, fax machines, printers and other electronic devices are routinely connected by communications cables to network equipment such as routers, switches, servers and the like. FIG. 1 illustrates the manner in which a computer 10 may be connected to a network device 30 (e.g., a network switch) using conventional communications plug/jack connections. As shown in FIG. 1, the computer 10 is connected by a patch cord 11 to a communications jack 20 that is mounted in a wall plate 18. The patch cord 11 comprises a communications cable 12 that contains a plurality of individual conductors (e.g., eight insulated copper wires) and first and second communications plugs 13, 14 that are attached to the respective ends of the cable 12. The first communications plug 13 is inserted into a plug aperture of a communications jack (not shown) that is provided in the computer 10, and the second communications plug 14 is inserted into a plug aperture 22 in the front side of the communications jack 20. The contacts or "blades" of the second communications plug 14 are exposed through the slots 15 on the top and front surfaces of the second communications plug 14 and mate with respective "jackwire" contacts of the communications jack 20. The blades of the first communications plug 13 similarly mate with respective jackwire contacts of the communications jack (not shown) that is provided in the computer 10.

The communications jack 20 includes a back-end wire connection assembly 24 that receives and holds insulated conductors from a cable 26. As shown in FIG. 1, each conductor of cable 26 is individually pressed into a respective one of a plurality of slots provided in the back-end wire connection assembly 24 to establish mechanical and electrical connection between each conductor of cable 26 and a respective one of a plurality of conductive paths (not shown in FIG. 1) through the communications jack 20. The other end of each conductor in cable 26 may be connected to, for example, the network device 30. The wall plate 18 is typically mounted on a wall (not shown) of a room of, for example, an office building, and the cable 26 typically runs through conduits in the walls and/or ceilings of the office building to a room in which the network device 30 is located. The patch cord 11, the communications jack 20 and the cable 26 provide a plurality of signal transmission paths over which information signals may be communicated between the computer 10 and the network device 30. It will be appreciated that typically one or more patch panels, along with additional communications cabling, would be included in the communications path between the cable 26 and the network device 30. However, for ease of description, in FIG. 1 the cable 26 is shown as being directly connected to the network device 30.

In the above-described communications system, the information signals that are transmitted between the computer 10 and the network device 30 are typically transmitted over a pair of conductors (hereinafter a "differential pair" or simply a "pair") rather than over a single conductor. An information signal is transmitted over a differential pair by transmitting signals on each conductor of the pair that have equal magnitudes, but opposite phases, where the signals transmitted on the two conductors of the pair are selected such that the information signal is the voltage difference between the two transmitted signals. The use of differential signaling can greatly reduce the impact of noise on the information signal.

Various industry standards, such as the TIA/EIA-568-C.2 standard approved in August 2009 by the Telecommunications Industry Association, have been promulgated that specify configurations, interfaces, performance levels and the like that help ensure that jacks, plugs and cables that are produced by different manufacturers will all work together. By way of example, the TIA/EIA-568-C.2 standard is designed to ensure that plugs, jacks and cable segments that comply with the standard will provide certain minimum levels of performance for signals transmitted at frequencies of up to 250 MHz. Most of these industry standards specify that each jack, plug and cable segment in a communications system must include a total of eight conductors 1-8 that are arranged as four differential pairs of conductors. The industry standards specify that, in at least the connection region where the contacts (blades) of a plug mate with the jackwire contacts of the jack (referred to herein as the "plug-jack mating region"), the eight conductors are generally aligned in a row. As shown in FIG. 2, under the TIA/EIA 568 type B configuration (which is the most widely followed), conductors 4 and 5 comprise differential pair 1, conductors 1 and 2 comprise differential pair 2, conductors 3 and 6 comprise differential pair 3, and conductors 7 and 8 comprise differential pair 4.

Unfortunately, the industry-standardized configuration for the plug jack mating region that is shown in FIG. 2, which was adopted many years ago, generates a type of noise known as "crosstalk." As is known to those of skill in this art, "crosstalk" refers to unwanted signal energy that is induced onto the conductors of a first "victim" differential pair from a signal that is transmitted over a second "disturbing" differential pair. Various techniques have been developed for cancelling out the crosstalk that arises in industry standardized plugs and jacks. Many of these techniques involve providing crosstalk compensation circuits in each communications jack that introduce "compensating" crosstalk that cancels out much of the "offending" crosstalk that is introduced in the plug and the plug-jack mating region due to the industry-standardized plug-jack interface. In order to achieve high levels of crosstalk cancellation, the industry standards specify pre-defined ranges for the crosstalk that is injected between the four differential pairs in each communication plug, which allows each manufacturer to design the crosstalk compensation circuits in their communications jacks to cancel out these pre-defined amounts of crosstalk. Typically, the communications jacks use "multi-stage" crosstalk compensation circuits as disclosed, for example, in U.S. Pat. No. 5,997,358 to Adriaenssens et al. (hereinafter "the '358 patent"), as multi-stage crosstalk compensating schemes can provide significantly improved crosstalk cancellation, particularly at higher frequencies. The entire contents of the '358 patent are hereby incorporated herein by reference as if set forth fully herein.

DETAILED DESCRIPTION

Figure 1:
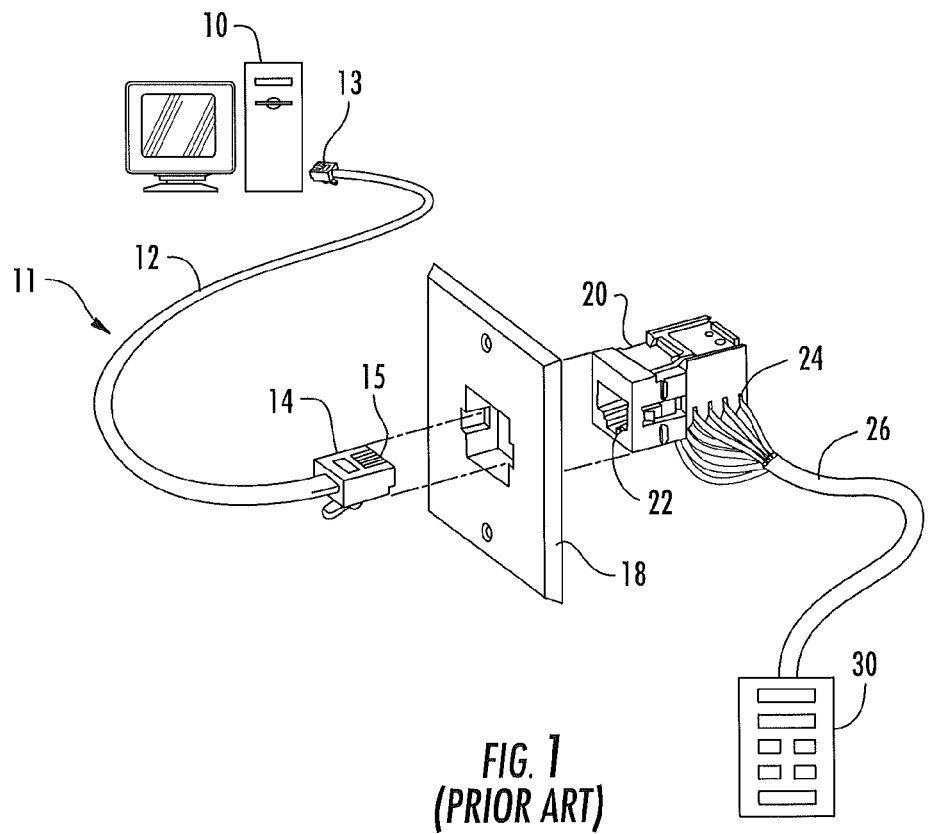
FIG. 1 is a schematic drawing that illustrates the use of communications plug-jack connectors to connect a computer to a network device.

Pursuant to embodiments of the present invention, communications jacks are provided that may have very short current paths along the plug contacts thereof as compared to communications jacks that use conventional plug contacts such as conventional jackwire contacts (the "current path" is the physical distance a signal travels along a structure such as a plug contact when passing through the structure). The current paths through the plug contacts of these jacks may be shortened because, for example, the jacks may use a separate spring to provide the requisite contact force as opposed to using conventional elongated jackwire contacts that resiliently deflect to provide the requisite contact force when the jack is mated with a communications plug. By shortening the current path through the plug contacts (which may also allow for the use of shorter plug contacts), the coupling between adjacent contacts may be advantageously reduced. Additionally, since the jacks according to embodiments of the present invention may have very short current paths through the plug contacts, it is typically possible to provide crosstalk compensating structures on a printed circuit board of the jack that are located at a small delay from the plug jack mating point. This may reduce the amount of offending crosstalk that is injected in a mated plug-jack combination, and also may allow for the compensating crosstalk to more effectively cancel out the offending crosstalk. The contacts may be designed to carry both data signals and electrical power signals that may be carried in Power-over-Ethernet applications. The jacks may comprise, for example, RJ-45 or RJ-11 jacks, although embodiments of the present invention are not limited thereto. Herein, a "plug contact" of a jack refers to a contact of the jack that is configured to mate with a blade of a plug that is received within the plug aperture of the jack. A jackwire contact is one type of plug contact. Typically, a jackwire contact comprises an elongated contact wire having a round or rectangular cross-section.

In some embodiments, the jacks may include a flexible printed circuit board and a plurality of separate, low-coupling plug contacts that mate with the respective blades of a mating plug. A "low coupling" plug contact refers to a plug contact that is designed to have reduced coupling with adjacent plug contacts as compared to conventional plug contacts. In some embodiments, the low-coupling plug contacts may comprise short, metal contacts that are directly connected to the flexible printed circuit board via, for example, welding, soldering, gluing or any other type of electrically active bond or connection. Each of the low-coupling contacts may be connected to, or operatively associated with, a spring (a single spring may be provided for all of the contacts, or multiple springs may instead be provided) so that each plug contact may be resiliently mounted. In some embodiments, the spring is attached to a housing of the jack, and respective dielectric contact extensions connect each plug contact to the spring, with the dielectric contact extensions providing substantial electrical parasitic isolation between the respective contacts and the metallic spring(s). In some embodiments, the spring or springs may be mounted in the housing such that they are "free floating" in that no part of the spring is physically bonded or otherwise fixedly attached to the housing.

In some embodiments, each plug contact may be mounted at two different locations within the jack. For example, each plug contact may include a first mounting location that is connected to a flexible printed circuit board and a second mounting location that is connected to the jack housing, typically through a dielectric contact extension and/or a spring. The flexible printed circuit board may include a plurality of cantilevered fingers, and each plug contact may be mounted on a respective one of these fingers. The provision of these fingers may allow for each plug contact to deflect a different amount so that good contact force may be maintained between each plug contact and its mating blade of a communications plug, even if the blades of the plug are not perfectly aligned. In some embodiments, both ends of each plug contact may be mounted on one or more flexible printed circuit boards.

Embodiments of the present invention will now be described with reference to the accompanying drawings, in which exemplary embodiments are shown.

Figure 3A:
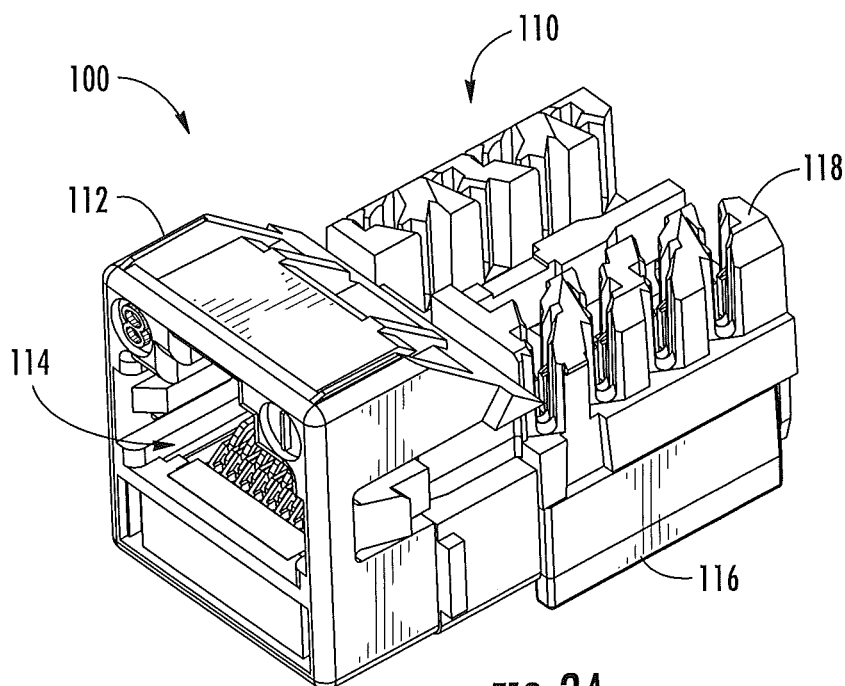
FIGS. 3A-3P illustrate a communications jack according to embodiments of the present invention.
Figure 3B:
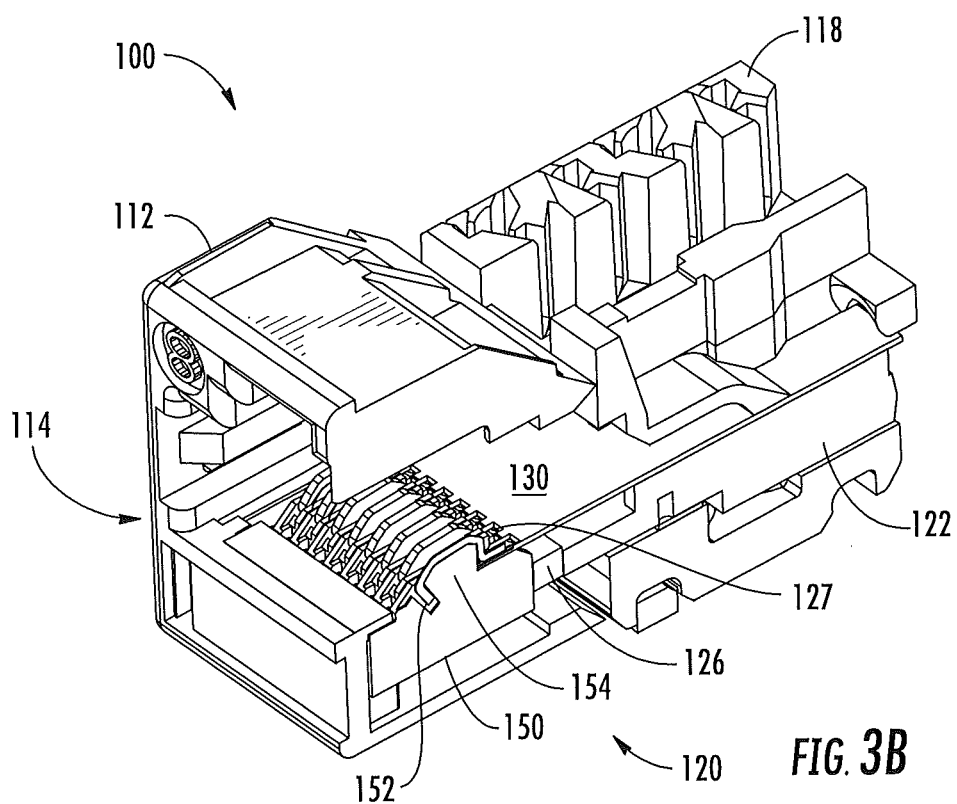
Figure 3C:
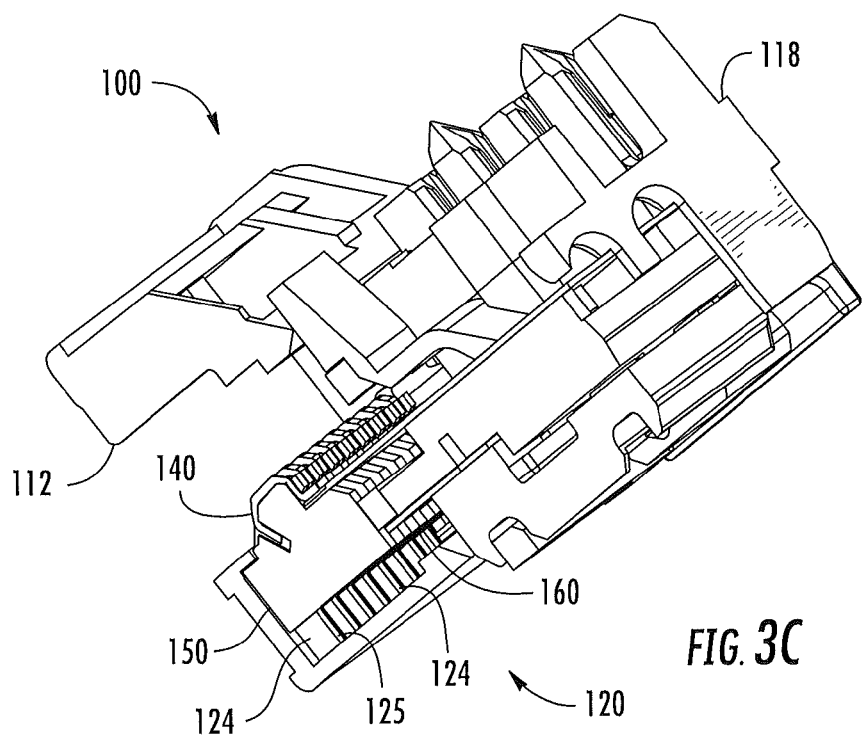
Figure 3D:
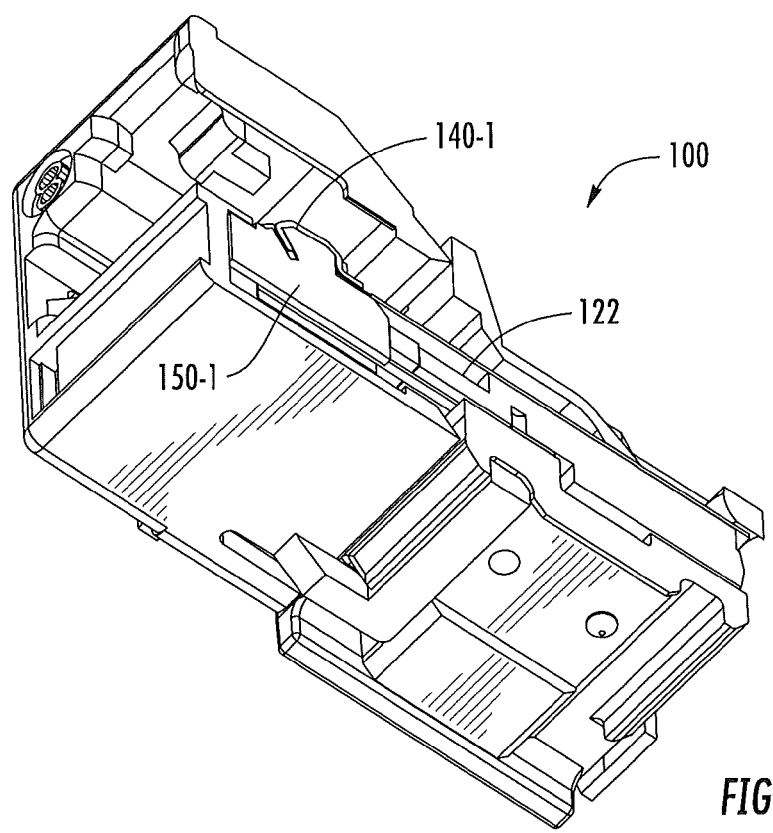
Figure 3E:
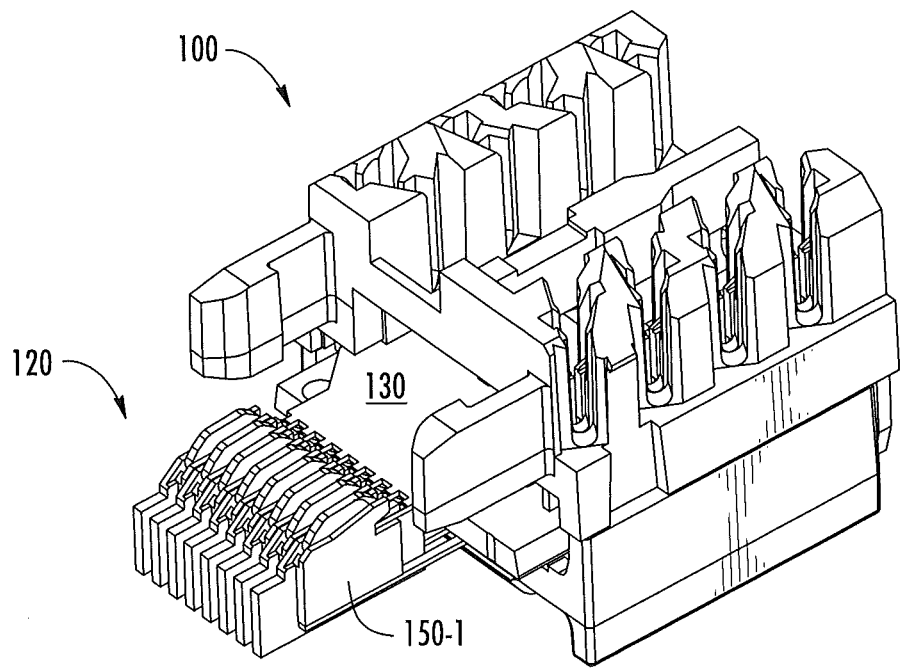
Figure 3F:
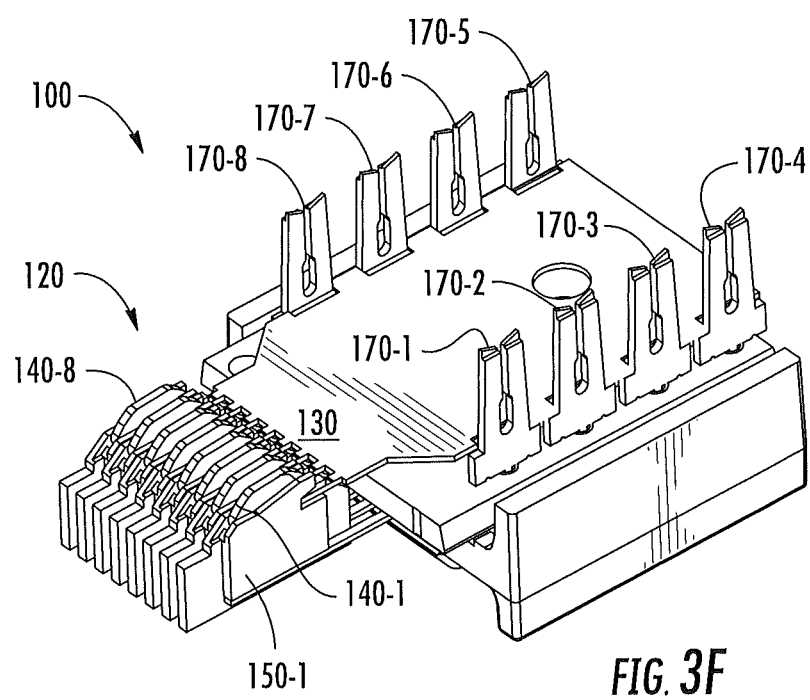
Figure 3G:
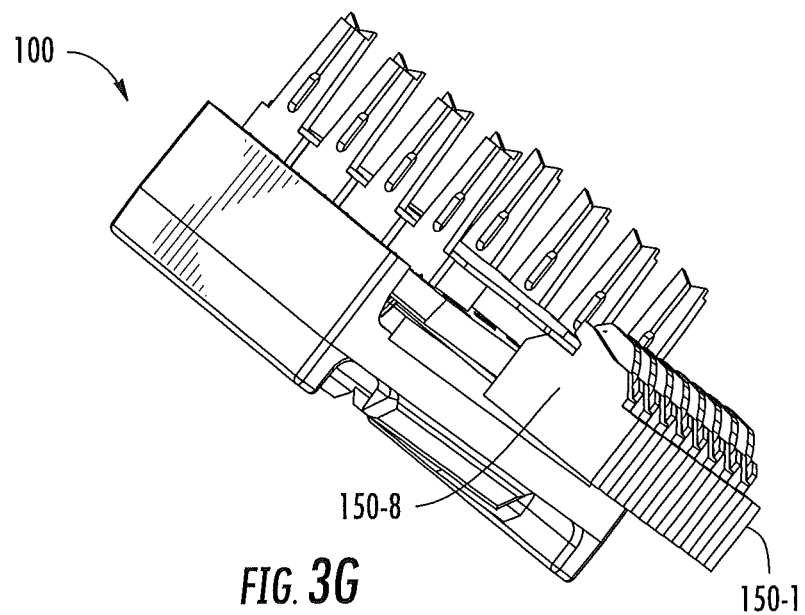
Figure 3H:
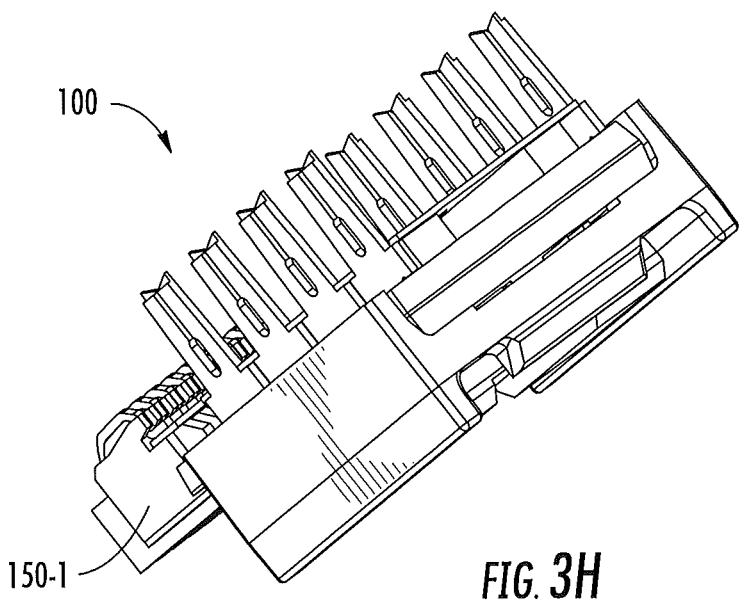
Figure 3I:
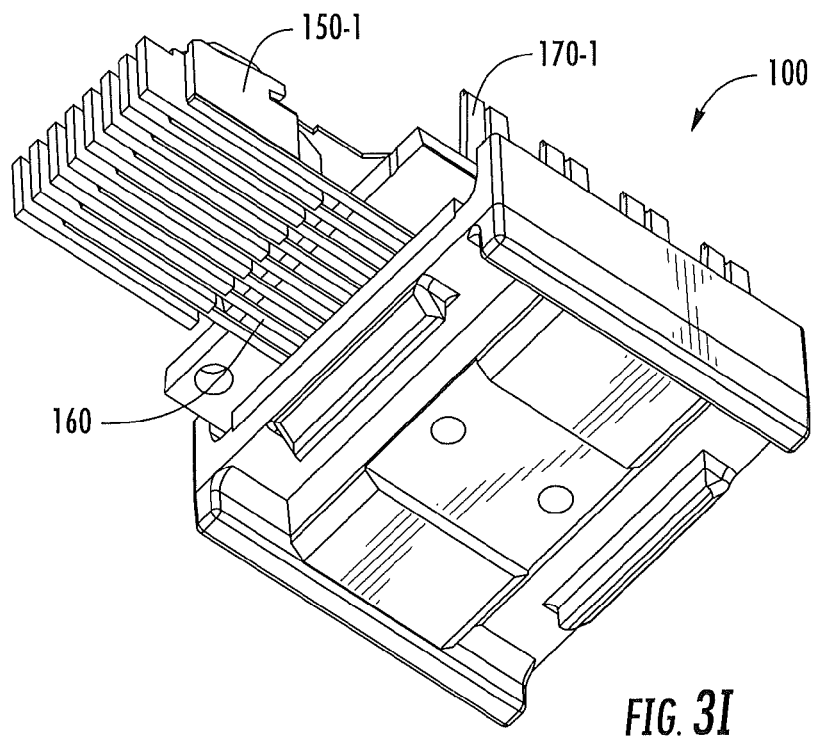
Figure 3J:
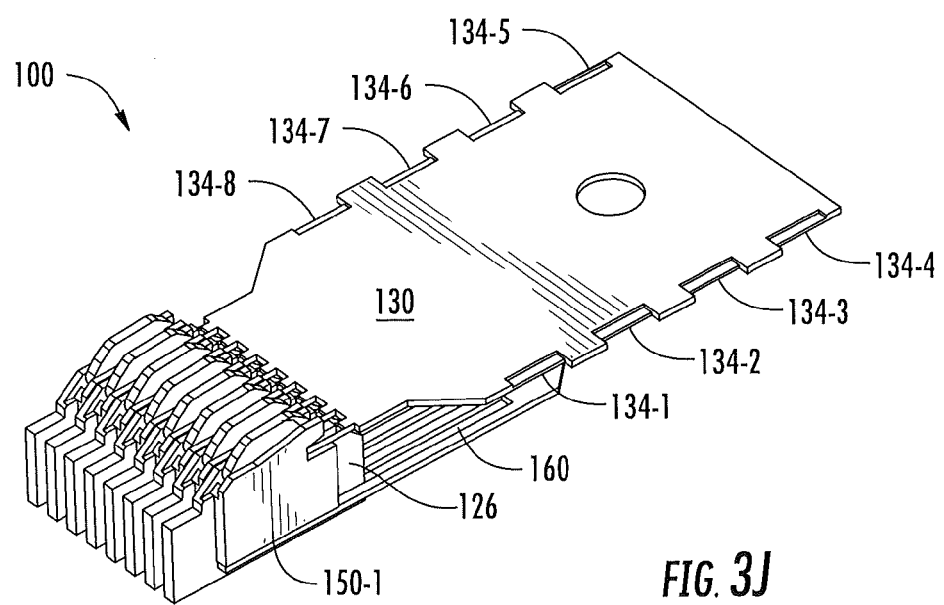
Figure 3K:
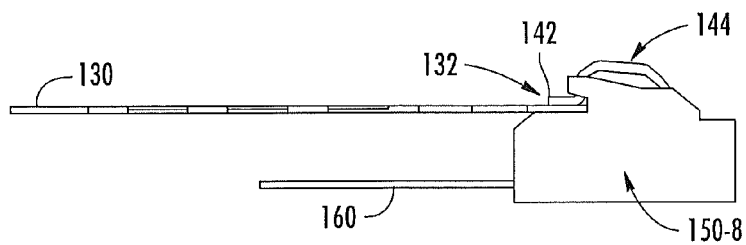
Figure 3L:
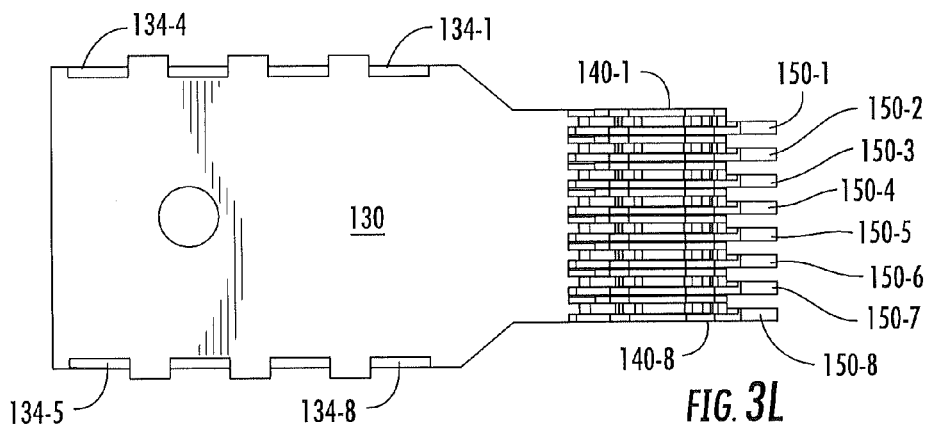
Figure 3M:
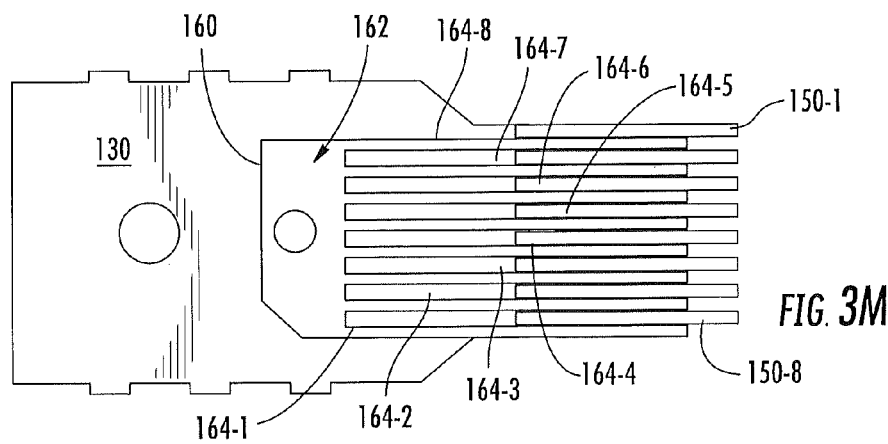
Figure 3N:
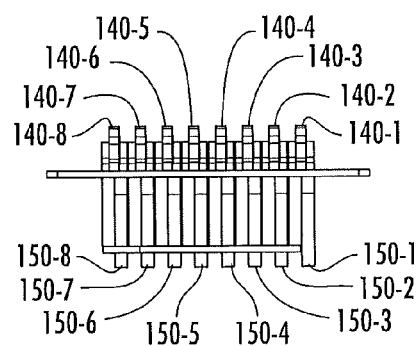
Figure 3O:
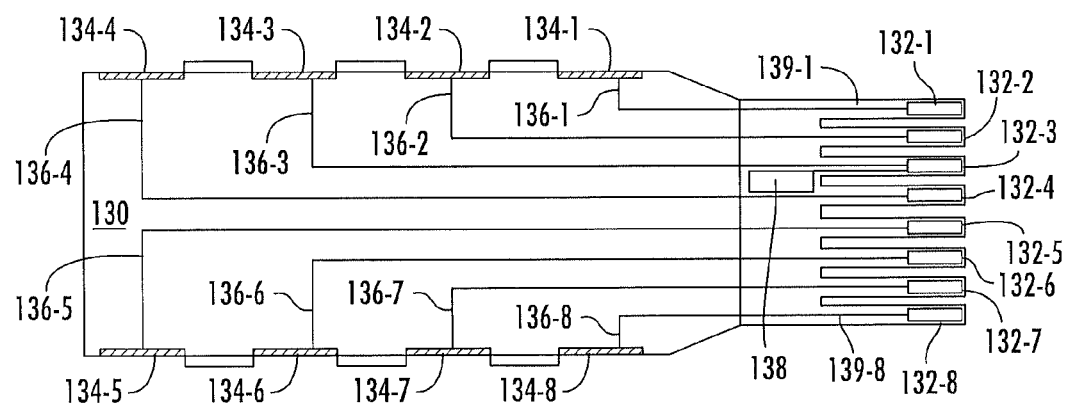
Figure 3P:
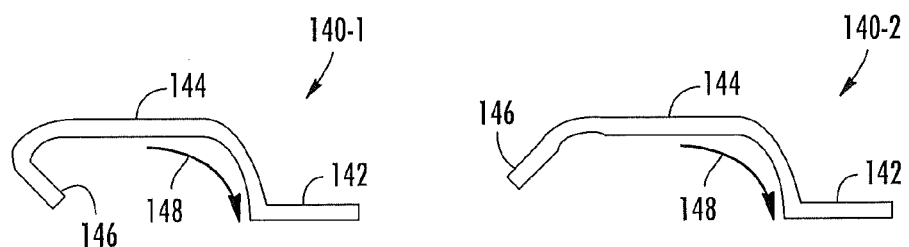

FIGS. 3A-3P illustrate a communications jack 100 according to embodiments of the present invention. In particular, FIG. 3A is a perspective view of the communications jack 100, and FIGS. 3B-3D are perspective cross-sectional views of the jack 100. FIG. 3E is a perspective view the jack 100 with the jack frame portion of the housing removed, and FIGS. 3F-3I are perspective views of the jack 100 with both the jack frame and the terminal housing removed. FIGS. 3J-3N are, respectively, a perspective view, a side view, a top view, a bottom view and a front view of a communications insert of the jack 100. FIG. 3O is a schematic plan view of a flexible printed circuit board of the jack 100 that illustrates various conductive elements that may be implemented therein or thereon. Finally, FIG. 3P illustrates two input (plug) contacts of the jack 100 that show how different ones of the input contacts of the jack 100 may have different side profiles.

As shown in FIG. 3A, the jack 100 includes a housing 110 that includes a jack frame 112, a cover 116 and a terminal housing 118. The jack frame 112 includes a plug aperture 114 for receiving a mating plug. The housing components 112, 116, 118 may be conventionally formed and need not be described in detail herein. Those skilled in this art will recognize that other configurations of jack frames, covers and terminal housings may also be employed with the present invention, and that the housing 110 may have more or less than three pieces. It will also be appreciated that, when mounted, the jack 100 is typically rotated 180 degrees about its longitudinal axis from the orientation shown in FIG. 3A so that the input contacts 140 (here, the plug contacts) of the jack 100 extend downwardly from the top of the plug aperture 114. In the discussion that follows, the relationship of the components of jack 100 with respect to each other will be described with respect to the orientation of FIG. 3A for convenience, but it will be appreciated that in use the jack 100 will more commonly be turned upside down from the orientation shown in FIG. 3A.

Referring next to FIGS. 3B-3D, it can be seen that the jack 100 includes a communications insert 120 that is received within an opening in the rear of the jack frame 112. The bottom of the communications insert 120 is protected by the cover 116, and the top of the communications insert 120 is covered and protected by the terminal housing 118. A substrate 122 is disposed between the cover 116 and the terminal housing 118. In some embodiments, the substrate 122 may comprise a printed circuit board, while in other embodiments the substrate 122 may simply comprise a planar plastic piece or any other suitable support structure. It will also be appreciated that the substrate 122 may be omitted in some embodiments or may be part of the cover 116. The communications insert 120 further includes a flexible printed circuit board 130, a plurality of input contacts 140, a plurality of dielectric contact extensions 150, a spring 160 and a plurality of output contacts 170 (see FIG. 3F), each of which will be discussed in further detail below.

The flexible printed circuit board 130 may comprise an elongated printed circuit board that is formed of a flexible material that may be bent in various ways. As shown in the figures, the flexible printed circuit board 130 may rest at least partly on a top surface of the substrate 122 and may be disposed in a planar position within the jack 100. The flexible printed circuit board 130 may include a plurality of layers that include conductive traces or other elements that are separated by dielectric layers, as is known to those of skill in the art. The flexible printed circuit board 130 may be used as a transmission medium for signals that pass between the input (plug) contacts 140 and the output contacts 170 of the jack 100.

FIG. 3O is a schematic plan view of the flexible printed circuit board 130. As shown in FIG. 3O, a plurality of conductive contact pads 132-1 through 132-8 are provided on the top surface of the flexible printed circuit board 130 towards the front end thereof. Herein, when the communications jacks according to embodiments of the present invention include multiple of the same components, these components may be referred to individually by their full reference numerals (e.g., contact pad 132-4) and may be referred to collectively by the first part of their reference numeral (e.g., the contact pads 132). The contact pads 132 may each be implemented, for example, as a copper pad which may optionally include gold and/or nickel plating on a top surface thereof. Electrically conductive structures other than contact pads may alternatively be used. As discussed below, the input contacts 140 can be welded, soldered or otherwise electrically connected to respective ones of the contact pads (or other structures) 132 in order to allow electrical signals (and electrical power signals) to pass between the flexible printed circuit board 130 and the respective input contacts 140. Thus, in some embodiments, the contact pads 132 may act as "mounting pads" for the input contacts 140.

As is further shown in FIG. 3O, the flexible printed circuit board 130 further includes a plurality of contact structures 134-1 through 134-8. Each contact structure 134 may comprise, for example, a contact pad that extends on the top surface and/or a side surface of the flexible printed circuit board 130. Each contact structure 134 may be designed to electrically connect to a respective one of the output contacts 170 (which are described in more detail below). It will be appreciated that the contact structures 134 may be implemented in a variety of other ways (e.g., as a metal-plated via), and may be any suitable contact/electrical connection that may be used to pass electrical signals between the respective output contacts 170 and the flexible printed circuit board 130.

The flexible printed circuit board 130 may act as a signal carrying structure that passes signals between the eight input contacts 140 and their respective eight output contacts 170 of the jack 100. In particular, as is shown in the schematic diagram of FIG. 3O, a plurality of conductive paths 136-1 through 136-8 are also provided. Each conductive path 136 connects a respective one of the contact pads 132 to its corresponding contact structure 134 in order to provide eight electrical paths through the flexible printed circuit board 130. Each conductive path 136 may be formed, for example, as a unitary conductive trace that resides on a single layer of the flexible printed circuit board 130 or as two or more conductive traces that are provided on multiple layers of the flexible printed circuit board 130 and which are electrically connected through metal-filled vias or other layer transferring techniques known to those of skill in the art. The conductive traces 136 may be formed of conventional conductive materials such as, for example, copper, and are deposited on the flexible printed circuit board 130 via any deposition method known to those skilled in this art.

A plurality of crosstalk compensation circuits 138 such as, for example, interdigitated finger capacitors, plate capacitors, inductively coupling traces and the like may also be provided on and/or within the flexible printed circuit board 130. Various exemplary crosstalk compensation structures are disclosed in the above referenced '358 patent. In some embodiments, at least some of these crosstalk compensation circuits 138 may be at a very short delay from the input contacts 140. For example, capacitors may be provided between contact pads on the flexible printed circuit board 130 that the input contacts 140 are welded or soldered too. One exemplary crosstalk compensation circuit 138 in the form of a plate capacitor (only the upper plate of the plate capacitor is visible) is illustrated in FIG. 3O.

As is further shown in FIG. 3O, the flexible printed circuit board 130 includes eight fingers 139-1 through 139-8 that extend from the front edge thereof (only fingers 139-1 and 139-8 are labeled to simplify the drawings, but it will be understood that the eight fingers 139-1 through 139-8 are aligned in a row in a numerical order). The eight fingers 139 may be formed by cutting seven longitudinally-extending slots into the forward edge of the flexible printed circuit board 130. The eight fingers 139 may move relatively independent of each other such that each finger 139 may be depressed a different distance downwardly when the jack 100 is mated with a communications plug. The ability of each finger 139 to move relatively independent of the other fingers 139 may improve the performance and reliability of the jack 100.

In particular, various industry standards specify various physical characteristics of what is required for a communications plug to qualify as an industry-standardized communications plug. The physical characteristics that are specified in these standards include the distances that portions of the plug blades must be from the top and front surfaces of the plug housing, and these standard specify ranges for these distances to accommodate manufacturing tolerances. Because ranges are specified, a communications plug may be industry-standard compliant even though its plug blades are not all the same distance from the top and/or front surfaces of the plug housing (i.e., the blades may be offset from each other in either or both the longitudinal direction and/or the vertical direction).

When a communications plug that has plug blades that are offset from each other is inserted into the jack 100, certain of the plug blades may engage their respective input (plug) contacts 140 of jack 100 sooner than other of the plug blades, thereby exerting a downward force on the engaged input contacts 140, which in turn exert a downward force on the front edge of the flexible printed circuit board 130. As the flexible printed circuit board 130 is pushed downwardly, it may draw the remaining input contacts 140 downward as well, pulling these input contacts 140 away from their respective plug blades. As a result, some of the input contacts 140 will exert a greater contact force against their respective plug blades (namely the input contacts 140 that are initially contacted by the offset plug blades) than will other of the input contacts 140. If the flexible printed circuit board 130 does not include the fingers 139, this effect may be magnified such that, under certain circumstances, some of the input contacts 140 may exhibit poor contact force against their respective plug blades. However, by providing the fingers 139, the degree to which the movement of a first of the input contacts 140 changes the position of other of the input contacts 140 may be reduced, and hence the jack 100 may be less susceptible to performance degradation when used with plugs that have plug blades that are offset from each other in the longitudinal and/or vertical directions.

As shown in, for example, FIGS. 3B and 3F, eight low coupling input contacts 140-1 through 140-8 are mounted in a row on a top surface of the flexible printed circuit board 130 (while not all of the input contacts 140 are individually labeled in the figures, it will be understood that the eight input contacts 140 are aligned in a row in numerical order). As shown in FIG. 3P (which illustrates two possible configurations of input contacts 140 that may be used in the jack 100), each input contact 140 has a base 142 that may, for example, be directly connected to the flexible printed circuit board 130, and a distal end 146. The base 142 may be connected to a respective one of the contact pads 132 by any appropriate means including, for example, welding, soldering or the like. In the embodiment of FIGS. 3A-3P, the distal end 146 of each input contact 140 is received within a slot 152 (see FIG. 3B) in a respective one of a plurality of dielectric contact extensions 150, which are described in more detail below. Each input contact 140 also includes a central region 144. The blades of a mating plug may physically engage this central region 144 when the mating plug is received within the plug aperture 114. The portion of an input contact 140 that is engaged by a mating plug is also referred to herein as the "plug contact region" of the input contact 140. The input contacts 140 may be formed of for example, a resilient metal or a non-resilient metal such as copper of gold-plated copper. In some embodiments, the input contacts 140 may comprise substantially rigid input contacts 140, meaning that the input contacts 140 do not flex more than a de minimis amount when engaged by the respective blades of a mating plug during normal use of the jack 100.

As is also shown in FIG. 3P, the middle portion 144 of each input contact 140 may be disposed at an oblique angle with respect to the base portion 142 of each input contact 140, as the base portion 142 may be a flat segment that is configured to be mounted on a top surface of the flexible printed circuit board 130, whereas the middle portion 144 may be raised above the flexible printed circuit board 130 to extend into the plug aperture 114 to engage a mating plug blade.

In some embodiments, all of the input contacts 140 may have the same profiles. However, in other embodiments the input contacts 140 may have different profiles. For example, as shown in FIG. 3P, in some embodiments the distal ends 146 of adjacent ones of the input contacts 140 may point in different directions (i.e., the distal ends 146 of input contacts 140-1, 140-3, 140-5 and 140-7 are bent to extend rearwardly, while the distal ends 146 of input contacts 140-2, 140-4, 140-6 and 140-8 are bent to extend forwardly). This configuration may reduce coupling (crosstalk) between the differential pairs by reducing the size of the region where adjacent input contacts 140 are close to each other and, in some designs, may even be used to introduce compensating crosstalk.

As shown, for example, in FIGS. 3B and 3N, eight dielectric contact extensions 150-1 through 150-8 are provided. In the depicted embodiment, each dielectric contact extension 150 comprises a planar piece of molded plastic. The eight dielectric contact extensions 150 each extend parallel to the longitudinal axis of the jack 100, and are aligned side-by-side in a row (in numerical order) in the transverse direction. Each of the dielectric contact extensions 150 may include a slot 152 (see FIG. 3B) that receives the distal end 146 of a respective one of the input contacts 140. The upper surface of each dielectric contact extension 150 may also be shaped to have an upward protrusion 154 that matches the lower surface of the central region 144 of its associated input contact 140. In this manner, each dielectric contact extension 150 may be mated with a respective one of the input contacts 140 so that each dielectric contact extension 150 and its respective input contact 140 move together as a single unit when a communications plug is inserted into the plug aperture 114 of jack 100 and physically engages the input contacts 140. Herein, a "dielectric contact extension" refers to an insulative member that is connected to a conductive contact of the jack that moves in conjunction with the contact.

As shown in FIGS. 3I and 3M, the communications insert 120 further includes a spring 160. The spring 160 may be connected to the low-coupling input contacts 140 through their respective dielectric contact extensions 150, and may be provided to allow the input contacts 140 and their associated dielectric contact extensions 150 to resiliently deflect downwardly when engaged by the blades of a plug that is received within the plug aperture 114 of jack 100. In the illustrated embodiment, a single spring 160 is provided that is used for all eight input contacts 140, but it will be appreciated that in other embodiments more than one spring 160 may be provided (e.g., a separate spring 160 could be provided for each of the input contacts 140). The spring 160 may be implemented, for example, as a piece of resilient metal such as beryllium-copper or phosphor-bronze that is mounted, for example, to a bottom surface of the substrate 122 by any appropriate means. However, it will be appreciated that a wide variety of different materials may be used to form the spring 160, including other metals, plastics, etc., and it will also be appreciated that the spring 160 may be implemented in many different forms (e.g., as a coiled spring, a cantilevered spring, etc.). As the spring 160 may be electrically isolated by the dielectric contact extensions 150 from the input contacts 140 (and hence is not part of the signal current carrying paths), increased flexibility is provided regarding the material used to form the spring 160 and the configuration of the spring 160. Consequently, it becomes possible to use, for example, cheap, strong springs such as, for example, coiled steel springs in place of the cantilevered springs illustrated in, for example, FIG. 3M.

As best shown in FIG. 3M, the spring 160 may comprise a comb-like structure that has a base 162 and eight fingers 164-1 through 164-8. Each of the dielectric contact extensions 150 may be mounted directly on top of a respective one of the eight fingers 164. The dielectric contact extensions 150-1 through 150-8 may be physically attached to the eight fingers 164-1 through 164-8, respectively, but they need not be. When a mating plug is received within the plug aperture 114, the plug blades deflect each respective input contact 140 and its associated dielectric contact extension 150 downwardly. The dielectric contact extensions 150, in turn, deflect each of the eight fingers 164 of spring 160 downwardly. As the spring 160 is resilient, the fingers 164 of the spring 160 exert an upward force on their respective dielectric contact extensions 150, thereby forcing each of the input contacts 140 upwardly to ensure that each input contact 140 engages its mating plug blade with sufficient contact force to ensure that a reliable electrical connection is maintained between the eight blades of the mating plug and the input contacts 140 with which they respectively mate.

As shown, for example, in FIGS. 3B and 3C, a plurality of front guiding walls 124 are provided that define a plurality of front guiding slots 125 therebetween. Likewise, a plurality of rear guiding walls 126 are provided that define a plurality of rear guiding slots 127 therebetween. In the illustrated embodiment, the front guiding walls 124 comprise plastic walls that are formed to extend from the bottom and front surfaces of the interior of the jack frame 112, and the rear guiding walls 126 comprise plastic walls that are formed to extend forwardly from the cover 116. The front and rear guiding slots 125, 127 may be used to maintain the dielectric contact extensions 150 (and hence the input contacts 140) in proper alignment. In particular, when a mating plug forces the input contacts 140 downwardly, the front and rear guiding slots 125, 127 keep the dielectric contact extensions 150 and their associated input contacts 140 in proper transverse alignment in order to maintain the input contacts 140 at desired distances from each other and to ensure that the input contacts 140 are properly aligned with their mating plug blades.

As shown best in FIG. 3F, eight output contacts or "terminals" 170-1 through 170-8 are also mounted to be in electrical contact with the flexible printed circuit board 130. In this particular embodiment, the eight output terminals 170 are implemented as insulation displacement contacts (IDCs) that are mounted in the substrate 122. As is well known to those of skill in the art, an IDC is a type of wire connection terminal that may be used to make mechanical and electrical connection to an insulated wire conductor. The IDCs 170 may be of conventional construction and need not be described in detail herein. Each IDC may either be directly electrically connected to the flexible printed circuit board 130 (e.g., via the respective contact structures 134), or may be indirectly electrically connected to the flexible printed circuit board 130 through one or more intervening structures such as, for example, the substrate 122. Any other appropriate output contact may be used including, for example, insulation piercing contacts or plug contacts. In other embodiments, the output contacts 170-1 through 170-8 may instead be implemented as conductive pads or other conductive structures on, for example, the flexible printed circuit board 130, and the wires of a communications cable may be welded or soldered directly to respective ones of these conductive pads.

The communications jack 100 may exhibit improved performance as compared to many conventional communications jacks. Most conventional RJ-45 communications jacks implement the plug contacts using spring jackwires that are elongated contact wires that are formed of beryllium-copper or phosphor-bronze. These contact wires may be formed to be sufficiently resilient such that the plug contact will meet industry standardized specifications with respect to the contact force that each plug contact applies to a mating plug blade and/or to ensure that the contact wires do not become permanently deformed with use. Typically, relatively long contact wires must be used in order to ensure that the contact wire provides the requisite contact force. In contrast, as is readily apparent from, for example, FIGS. 3C and 3P, the plug contacts 140 according to embodiments of the present invention may be much shorter and thus the current path through each of the input contacts 140 may be very short in length. This current path is illustrated by the arrows labeled 148 in FIG. 3P, and extends in each case from a middle region 144 of the input contact 140 (i.e., the part of the plug contact that engages a mating plug blade) to the base 142 of the contact 140. In some embodiments, the length of the current path 148 through each of the input contacts 140 may be on the order of about 80 mils to about 120 mils, which is far less than the current path through most conventional spring jackwire contacts. As a result of this very short current path 148, it is possible to inject either capacitive and/or inductive crosstalk compensation on the flexible printed circuit board 130 at a point that is very close in time to the plug jack mating point, which may result in more effective crosstalk cancellation. Additionally, as is discussed above, the short length of the current path 148 also may advantageously reduce coupling, and hence crosstalk, between adjacent input contacts 140.

Figure 4A:
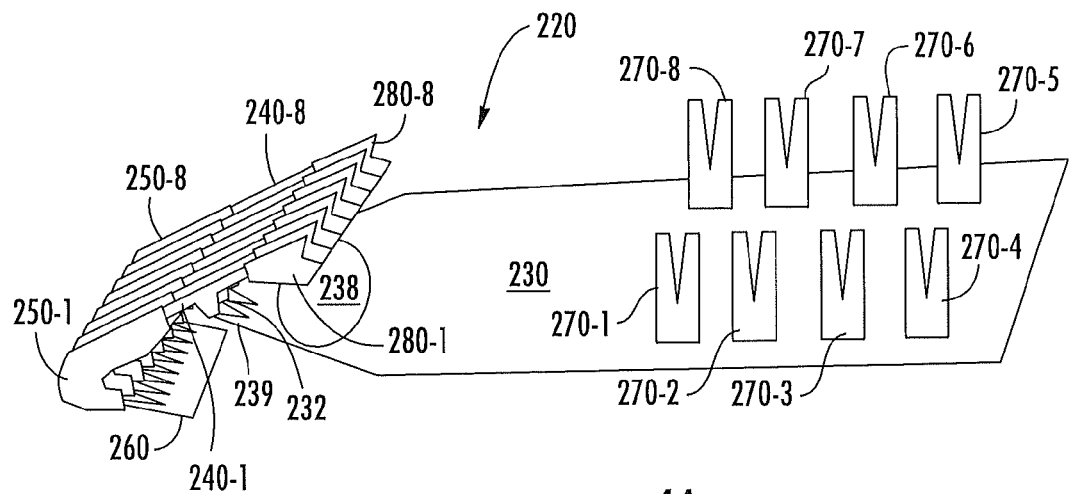
FIG. 4A is a schematic perspective view of a communications insert for a communications jack according to further embodiments of the present invention.
Figure 4B:
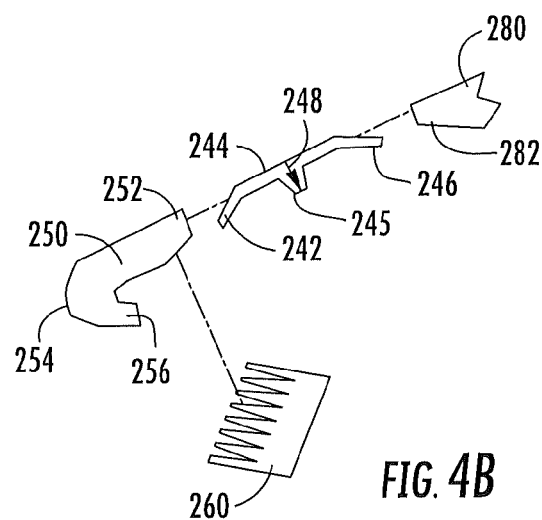
FIG. 4B is an exploded side view of one of the low-coupling contacts of the communications jack of FIG. 4A.

FIGS. 4A and 4B illustrate a communications insert 220 according to further embodiments of the present invention. In particular, FIG. 4A is a schematic perspective view of the communications insert 220, while FIG. 4B is an exploded perspective view of a spring 260 and one of the input contacts 240 that are part of the communications insert 220. The communications insert 220 may be inserted into a jack housing (not shown) to provide a communications jack 200. Any appropriate housing structure may be used such as, for example, a housing that is identical or similar to the housing 110 of the communications jack 100.

As shown in FIG. 4A, the communications insert 220 includes a flexible printed circuit board 230, a plurality of input contacts 240-1 through 240-8, a plurality of lower dielectric contact extensions 250-1 through 250-8, a spring 260, a plurality of output contacts 270-1 through 270-8 and a plurality of upper dielectric contact extensions 280-1 through 280-8. While only input contacts 240-1 and 240-8, lower dielectric contact extensions 250-1 and 250-8, and upper dielectric contact extensions 280-1 and 280-8 are labeled in FIG. 4A due to space constraints in the drawing, it will be appreciated that the input contacts 240, the lower dielectric contact extensions 250 and the upper dielectric contact extensions 280 are each aligned in respective rows and consecutively numbered. It will also be appreciated that this same labeling convention is used in FIGS. 5-8 due to similar space constraints in those figures.

The output contacts 270 may comprise, for example, conventional IDCs and hence will not be discussed further herein. Each of the remaining components is described in more detail below.

As shown in FIG. 4A, the flexible printed circuit board 230 may be similar to the flexible printed circuit board 130 of the communications jack 100. In particular, the flexible printed circuit board 230 may have an elongated shape and may have eight fingers 239 on a forward end thereof. The fingers 239 may function in the same manner as the fingers 139 of the flexible printed circuit board 130 that is described above, and hence will not be described further here. Eight metal (e.g., copper) pads 232 are provided on the top surface of the flexible printed circuit board 230, with a contact pad 232 provided on the upper surface of the respective fingers 239. The input contacts 240 are welded, soldered or otherwise electrically connected to respective ones of the metal pads (or other structures) 232 in order to allow electrical signals to pass between the flexible printed circuit board 230 and the respective input contacts 240. The flexible printed circuit board 230 further includes a plurality of contact structures (not shown) that may be used to electrically connect each of the output contacts 270 to the flexible printed circuit board 230. These contact structures may be, for example, similar or identical to the contact structures 134 that are discussed above with respect to the jack 100. Finally, the flexible printed circuit board 230 may include a plurality of conductive paths (not shown) that connect each respective contact pad 232 to a corresponding one of the output contacts 270, as well as a plurality of crosstalk compensation structures 238, as is discussed above with respect to the flexible printed circuit board 130 of jack 100.

The communications insert 220 further includes eight low coupling input contacts 240-1 through 240-8, which are mounted in a row on the respective fingers 239 of the flexible printed circuit board 230. Each of these input contacts 240 is configured to engage a respective blade of a mating plug when the plug is received within the jack 200. As shown best in FIG. 4B, each input contact 240 has a lower end 242, a central portion 244, a pad contact region 245 and an upper end 246. The manner in which the input contacts 240 work with other components (namely the lower and upper dielectric contact extensions 250, 280 and the spring 260) to mate with the blades of a mating plug will be discussed in more detail below.

As is also shown in FIG. 4B, each lower dielectric contact extension 250 may comprise an elongated dielectric piece that has an upper end 252, a curved section 254 and a lower end 256. The lower end 256 may be insertion molded onto the spring 260 or otherwise operatively connected to the spring 260 (e.g., glued thereto or otherwise directly or indirectly connected thereto). The spring 260 may be similar or identical to the spring 160 that is discussed above, and hence the spring 260 will not be discussed further herein. The upper end 252 of each lower dielectric contact extension 250 may be insertion molded onto or otherwise connected to the lower end 242 of a respective one of the input contacts 240. Consequently, each lower dielectric contact extension 250 may be mated with a respective one of the input contacts 240 so that each lower dielectric contact extension 250 and its respective input contact 240 move together as a single unit when a communications plug is inserted into the plug aperture (not shown) of the jack 200 so as to physically engage the input contacts 240. The lower dielectric contact extensions 250 may each extend parallel to the longitudinal axis of the flexible printed circuit board 230, and may be aligned side-by-side in a row in the transverse direction. The lower dielectric contact extensions 250 may thus resiliently mount the input contacts 240 via the spring 260 while electrically isolating the input contacts 240 from the spring 260. The lower dielectric contact extensions 250 may also slidably move within slots in the housing (not shown) in order to keep the input contacts 240 in proper alignment in the same manner that the dielectric contact extensions 150 of jack 100 may slidably move within slots 125 in the jack housing 110.

The upper dielectric contact extensions 280 may also each comprise an elongated dielectric piece that has a lower end 282 that is molded onto or otherwise connected to the upper end 246 of a respective one of the input contacts 240 such that each input contact 240 and its associated upper dielectric contact extension 280 move together as a single unit when a communications plug is inserted into the plug aperture (not shown) of the jack 200. The upper dielectric contact extensions 280 may each extend parallel to the longitudinal axis of the flexible printed circuit board 230, and may be aligned side-by-side in a row in the transverse direction. The upper dielectric contact extensions 280 may also slidably move within slots in the housing (not shown) in order to help keep the input contacts 240 in proper alignment.

As shown in FIG. 4A, the pad contact region 245 of each input contact 240 may be attached to a respective one of the pads 232 that are provided on the upper surface of the fingers 239 of flexible printed circuit board 230. In some embodiments, each input contact 240 may be welded or soldered to its respective pad 232. In other embodiments, other attachment techniques may be used. In still other embodiments, the input contacts 240 may not actually be connected to their respective pads 232, but instead the jack 200 may be designed so that when a plug is received within the plug aperture of the jack the input contacts 240 are forced downwardly such that they come into physical and electrical contact with their respective pads 232 to allow signals to pass from the plug blades to the input contacts 240. When the plug is removed from the plug aperture, the input contacts 240 may return to their normal resting position and no longer be in contact with their respective contact pads 232.

When a plug is inserted into the plug aperture of jack 200, each plug blade may engage its respective input contact 240 in the middle portion 244 of the contact that is opposite the pad contact region 245. As is evident from FIGS. 4A and 4B, this may result in an extremely short current path 248 through each of the input contacts 240 (e.g., as small as about 10 mils to about 30 mils). One or more crosstalk compensation circuits 238 may also be included on the flexible printed circuit board 230, as is shown schematically in FIG. 4A, and may be located close to the contact pads 232. As a result of this very short current path 248, it is possible to inject either capacitive and/or inductive crosstalk compensation on the flexible printed circuit board 230 at a point that is very close in time to the plug-jack mating point, which may provide more effective crosstalk cancellation.

The jack 200 may operate similar to the jack 100 and may provide many or all of the advantages provided by the jack 100 that are discussed above.

Figure 5:
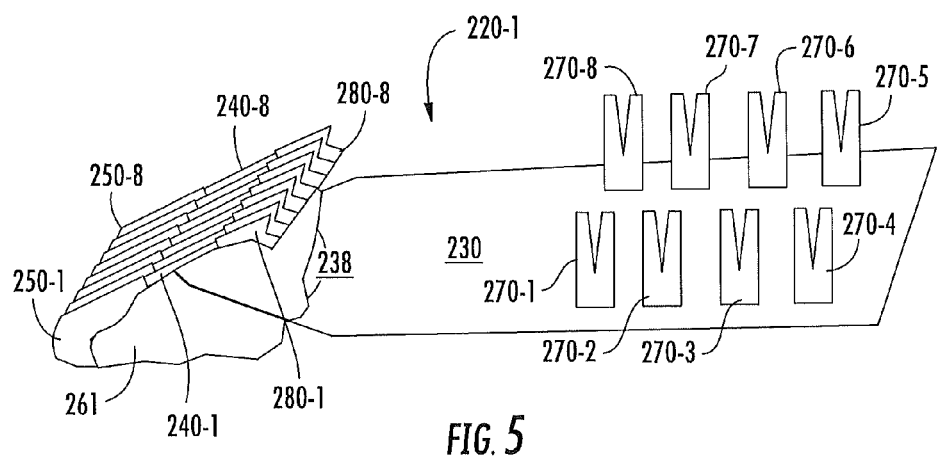
FIG. 5 is a schematic perspective view of a communications insert for a communications jack according to still further embodiments of the present invention.

FIG. 5 is a schematic perspective view of a communications insert 220-1 according to further embodiments of the present invention which may be used in place of the communications insert 220.

As shown in FIG. 5, the communications insert 220-1 may be almost identical to the communications insert 220 that is described above with respect to FIGS. 4A and 4B, except that the resilient metal spring 260 of the communications insert 220 is replaced with a rubber (or other suitable material) injection fill spring 261 that supports the input contacts 240 in the communications insert 220-1. The injection fill spring 261 may fill both the area between the bottom surface of the forward portion of the flexible printed circuit board 230 and the lower dielectric contact extensions 250, and the area between the top surface of the forward portion of the flexible oriented circuit board 230 and the input contacts 240 and upper dielectric contact extensions 280. The lower dielectric contact extensions 250 may, for example, be mounted in the injection fill spring 261, as illustrated in FIG. 5. The communications insert 220-1 may operate in essentially the exact same fashion as the communications insert 220 discussed above, with the only difference being the use of a different spring mechanism.

Figure 6:
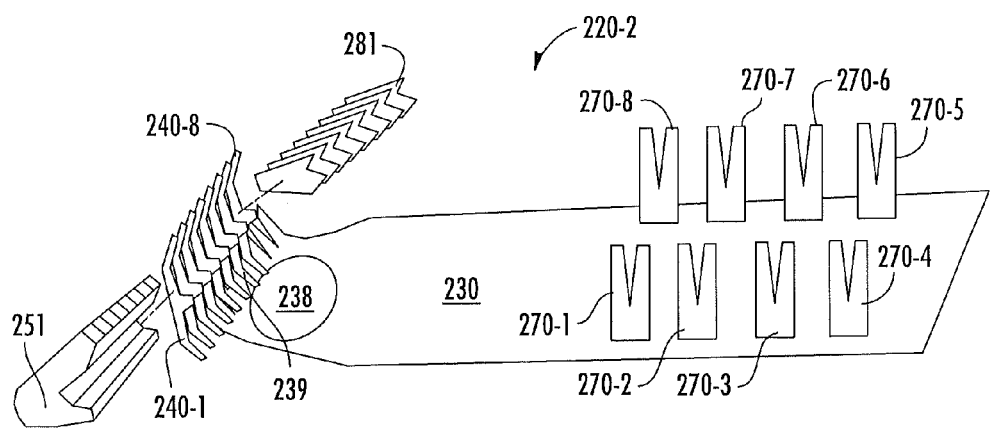
FIG. 6 is an exploded schematic perspective view of a communications insert for a communications jack according to still further embodiments of the present invention.

FIG. 6 is a schematic perspective view of a communications insert 220-2 according to further embodiments of the present invention which may be used in place of the communications insert 220.

As shown in FIG. 6, the communications insert 220-2 is similar to the communications inserts 220 and 220-1 that are discussed above. However, the communications insert 220-2 omits any separate spring (such as the spring 260 of communications insert 220 or the spring 261 of communications insert 220-1), and instead uses the resiliency of the flexible printed circuit board 230 to ensure that the contacts 240 press against their respective plug blades with sufficient contact force. Note that in the communications insert 220-2, the input contacts 240 are attached to the lower side of the fingers 239 of the flexible printed circuit board 230. Additionally, the communications insert 220-2 also differs from the communications inserts 220 and 220-1 in that the plurality of lower dielectric contact extensions 250 and the plurality of upper dielectric contact extensions 280 are replaced in communications insert 220-2 with a unitary lower dielectric support 251 and a unitary upper dielectric support 281 that act as guides to keep the contacts 240 in proper alignment. The remainder of communications insert 220-2 may be identical to the communications insert 220 described above, and hence further description of communications insert 220-2 will be omitted.

Figure 7A:
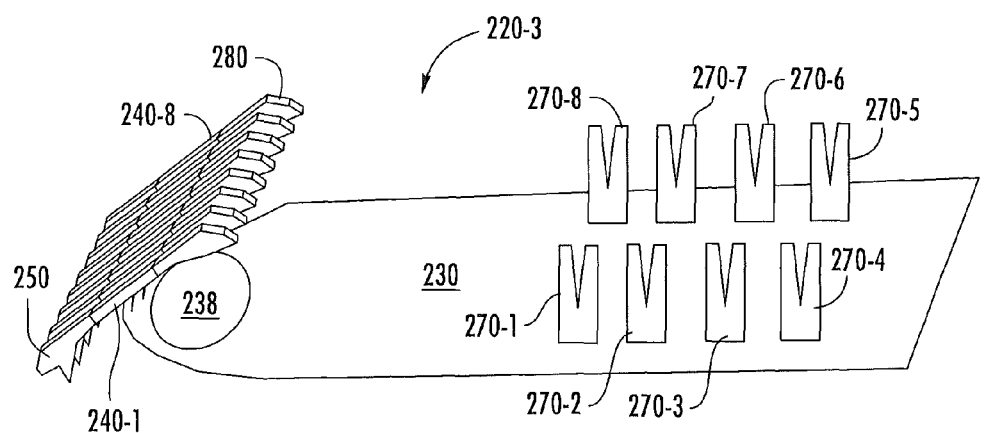
FIG. 7A is a schematic perspective view of a communications insert for a communications jack according to yet further embodiments of the present invention.

FIGS. 7A-7E illustrate a communications insert 220-3 according to further embodiments of the present invention. In particular, FIG. 7A is a schematic perspective view of the communications insert 220-3, while FIGS. 7B-7E illustrate a method of manufacturing the low-coupling contacts 240 included in the communications insert 220-3.

Referring to FIG. 7A, it can be seen that the communications insert 220-3 is similar to the communications insert 220-2 of FIG. 6. As with the communications insert 220-2, the communications insert 220-3 does not include a separate spring, but instead uses the resiliency of the flexible printed circuit board 230 to ensure that the contacts 240 press against their respective plug blades with sufficient contact force. In order to provide this resiliency, the front portion of the flexible printed circuit board 230 is folded back on itself, and each of the input contacts 240 is attached to a contact pad 232 that is provided on the lower surface of a respective finger 239 of the flexible printed circuit board 230. The communications insert 220-3 also uses a different design for the contacts 240, as is most clearly shown in FIG. 7B. Finally, the communications insert 220-3 includes both a plurality of lower dielectric contact extensions 250 and the plurality of upper dielectric contact extensions 280 (similar to communications inserts 220 and 220-1) as opposed to the unitary lower dielectric support 251 and the unitary upper dielectric support 281 that are provided in the communications insert 220-2.

Figure 7B:
FIGS. 7B-7E illustrate a method of manufacturing the low-coupling contacts included in the communications insert of FIG. 7A.
Figure 7C:
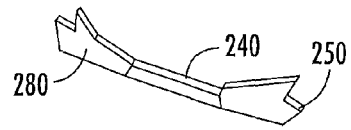
Figure 7D:
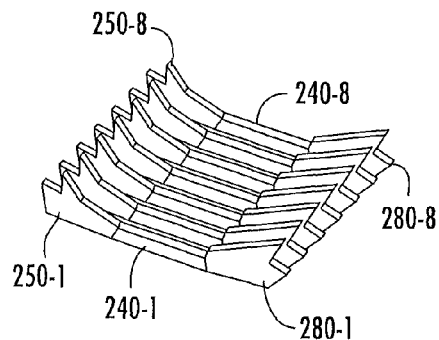
Figure 7E:
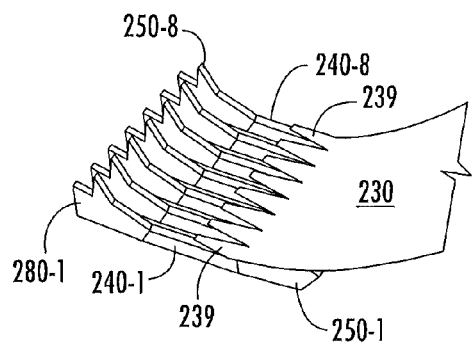

Referring now to FIGS. 7B through 7E, a method of manufacturing the input contacts 240 and attaching them to the flexible printed circuit board 230 is illustrated. In particular, as shown in FIG. 7B, each of the input contacts 240 may be implemented using a square wire pin that is crimped at the ends thereof As shown in FIG. 7C, once the input contacts 240 are formed, a lower dielectric contact extension 250 and an upper dielectric contact extension 280 may be attached to the respective ends of the input contact 240 by any appropriate method such as, for example, insertion molding. Next, as shown in FIG. 7D, the eight input contacts 240 with their respective lower and upper dielectric contact extensions 250, 280 mounted thereon may be aligned side-by-side in a row. Finally, as shown in FIG. 7E, solder or spot welding may be used to permanently attach the underside of each of the input contacts 240 to a respective one of the contact pads (not visible) that are provided on the lower surface of the respective fingers 239 of the flexible printed circuit board 230.

Figure 8:
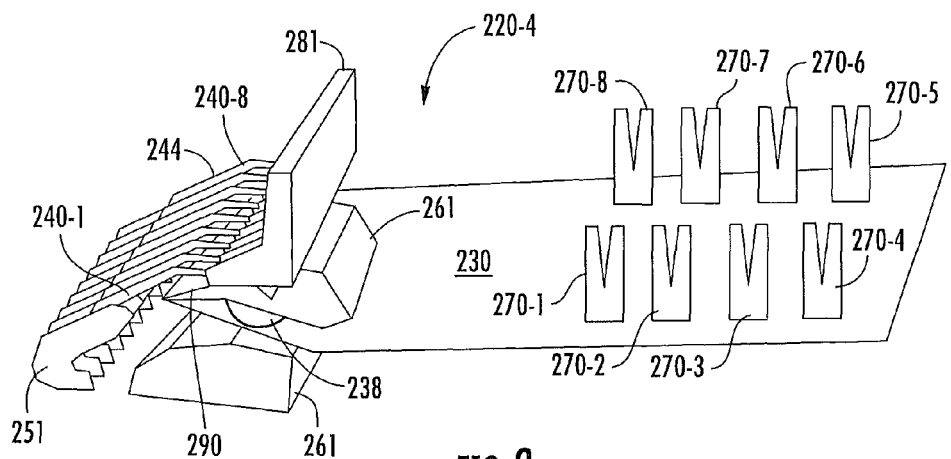
FIG. 8 is a schematic perspective view of a communications insert according to still further embodiments of the present invention.

FIG. 8 is a schematic perspective view of the communications insert 220-4 according to still further embodiments of the present invention Referring to FIG. 8, it can be seen that the communications insert 220-4 includes a flexible printed circuit board 230 that may include crosstalk compensation circuitry 238 thereon, and a plurality of input contacts 240-1 through 240-8. The input contacts 240 may be mounted on the flexible printed circuit board 230 in the manner described above with respect to, for example, FIG. 4A. However, in the embodiment of FIG. 8, the input contacts 240 have been elongated slightly so that they include a longer middle portion 244. The extra length added to the middle portion 244 of the input contacts 240 allows the blades of a mating plug to engage each input contact 240 in one place, and then slide for a short distance along the middle portion 244 of the input contact 240 as the plug is fully inserted into the plug aperture of the jack that includes communications insert 220-4. This may provide for better performance when the communications insert 220-4 is used in jacks that include power-over-Ethernet capability. Relevant standards for Power-over-Ethernet connections are provided, for example, in the IEEE 8023 standard.

In particular, as is well known to those of skill in the art, some communications jacks include power-over-Ethernet capabilities where a power signal (e.g., a direct current voltage) is supplied to the jack over the Ethernet conductors thereof that may be used to power equipment that is connected to the jack. In such Power-over-Ethernet applications, the contacts of the jack must support both the currents associated with the data signals as well as additional currents that provide electrical power to the jack. However, when plugs are removed from such power-over-Ethernet jacks, the power current may cause arcing to occur at the point on each input contact 240 that last releases contact with its mating plug blade, and this arcing can degrade the electrical properties of this portion of each input contact 240 over time. By designing the input contacts 240 so that they will ride for a short distance along their respective plug blades, the plug blades will break contact at one portion of their respective input contacts but then mate at a different portion of their input contacts once the plug is fully inserted the next time within the jack. In the actions described herein it should be seen that dividing the flexing function and the high stress electrical function between the flex board and small contact structures provides a superior solution capable of meeting higher performance power and signaling.

Similar to communications insert 220-2 of FIG. 6, the communications insert 220-4 of FIG. 8 includes a unitary lower contact guide 251 and a unitary upper contact guide 281 that act to keep the input contacts 240 in proper alignment when they move in response to a plug being inserted into, or removed from, a jack that includes the communications insert 220-4. The communications insert 220-4 further includes a two-piece resilient, soft rubber wedge guide 261 that may ensure that the input contacts 240 engage their respective plug blades with sufficient contact force. Finally, an additional rubber wedge support 290 is provided that supports the upper contact guide 281.

Figure 9A:
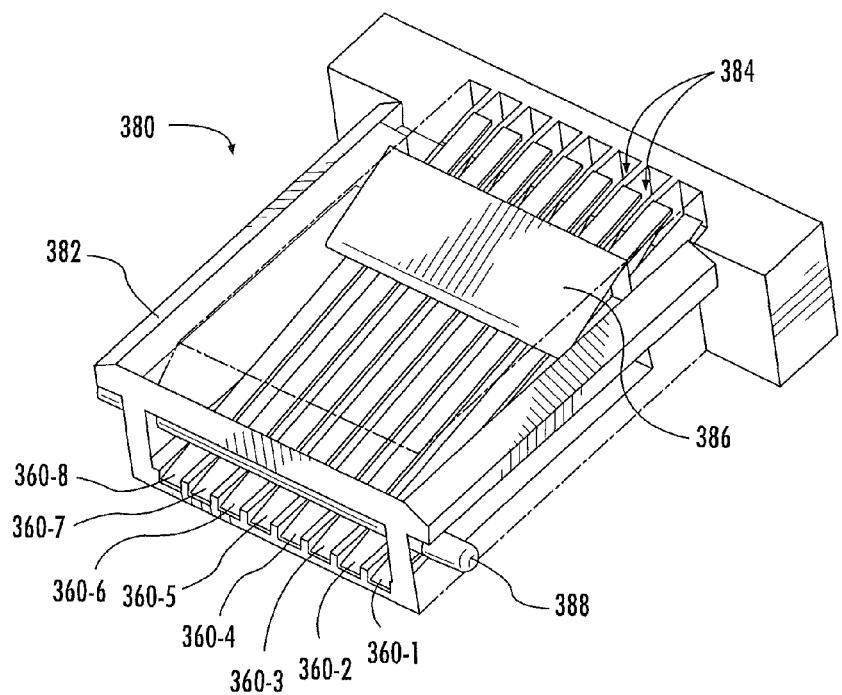
FIGS. 9A-9F are various views of a communications jack and components thereof according to still further embodiments of the present invention.
Figure 9B:
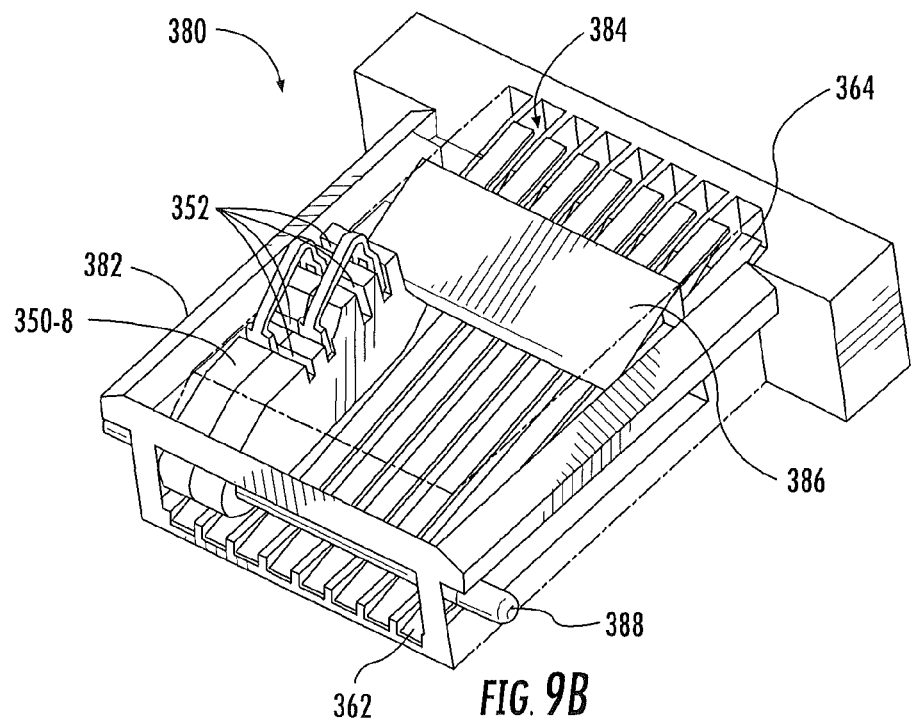
Figure 9C:
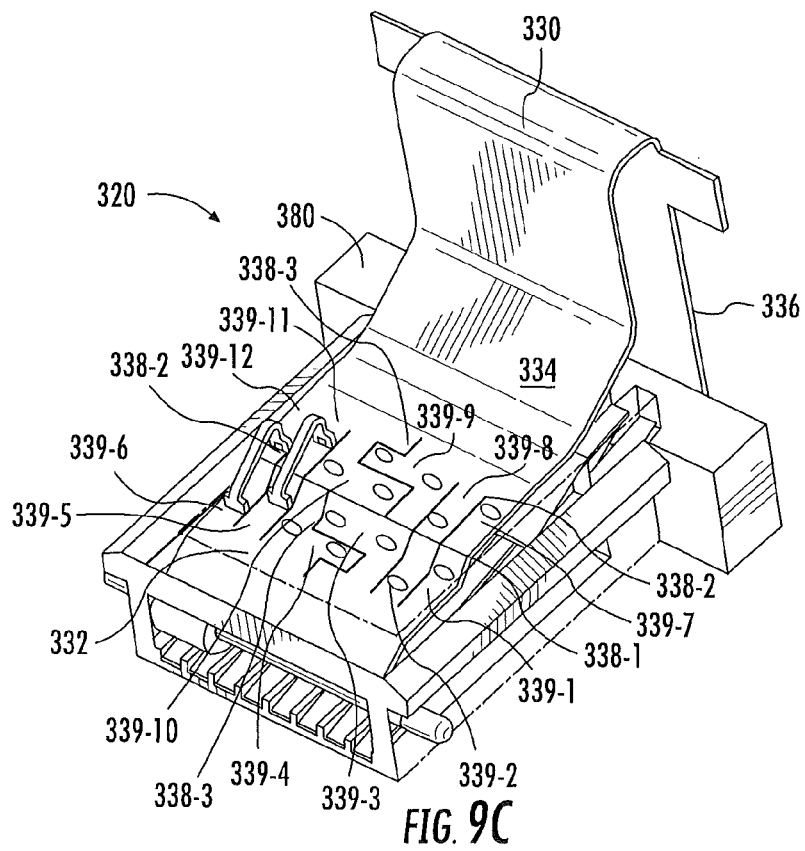
Figure 9D:
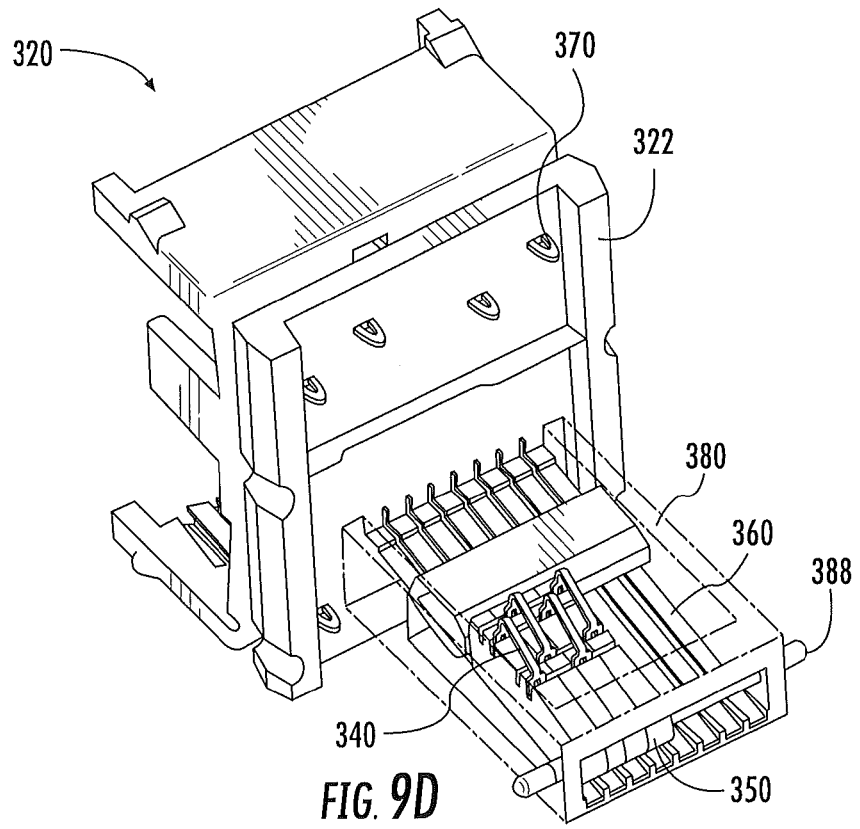
Figure 9E:
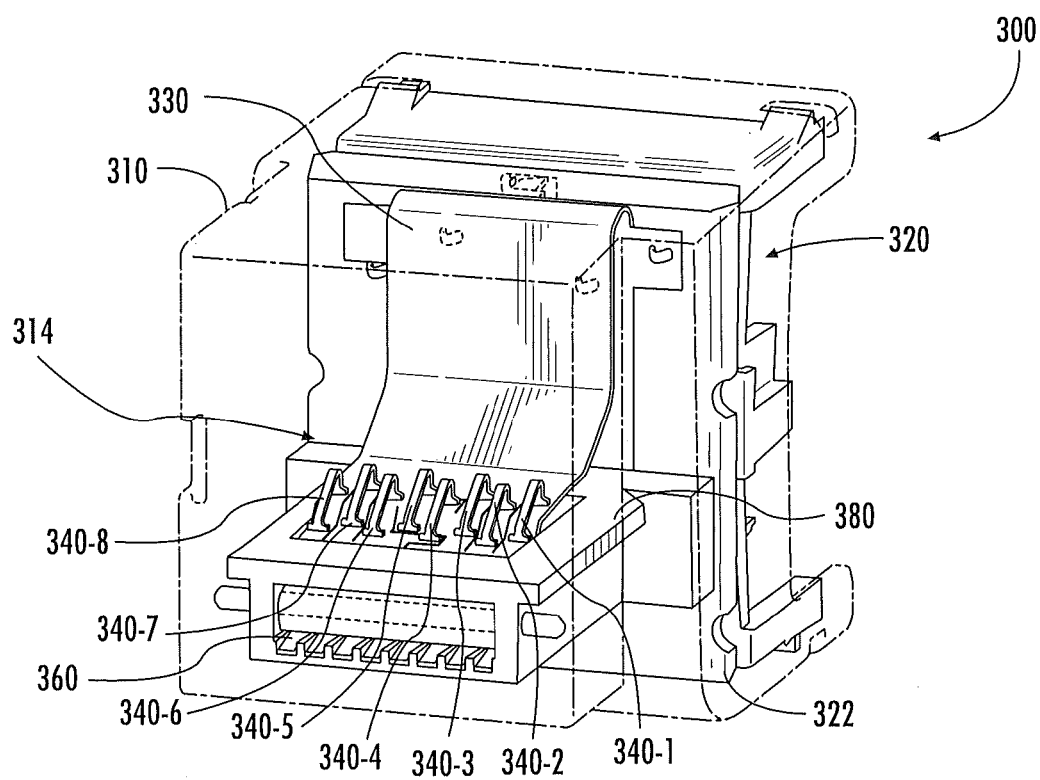
Figure 9F:
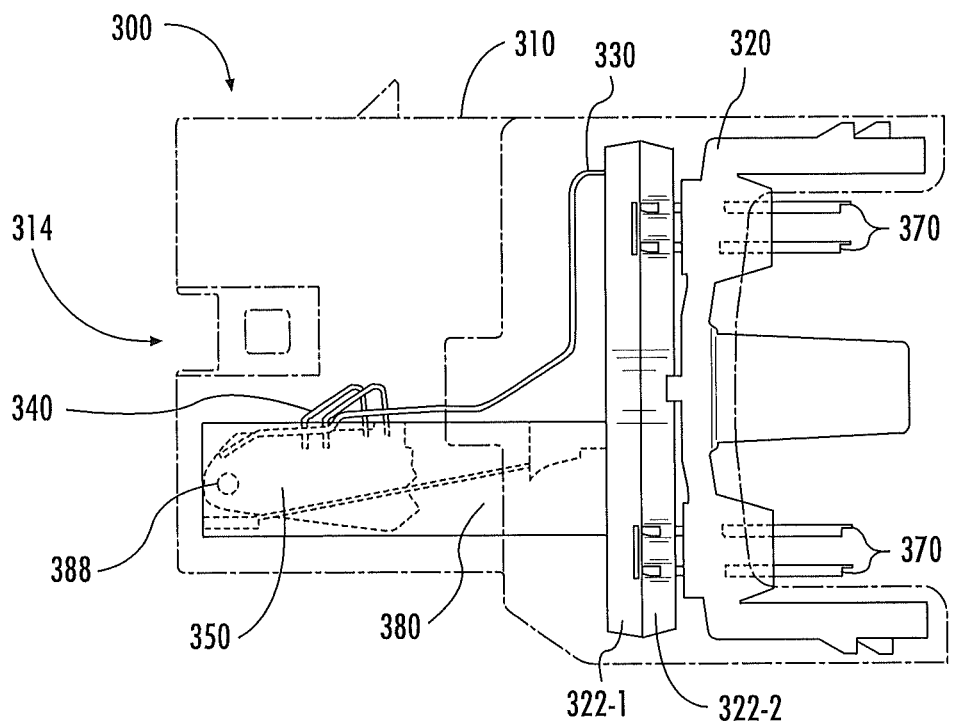

FIGS. 9A-9F illustrate a communications jack 300 according to still further embodiments of the present invention. In particular, FIG. 9A is a perspective view of a spring holder of the jack 300. FIG. 9B is a perspective view of the spring holder of FIG. 9A that further includes two dielectric contact extensions, each of which has a jackwire contact mounted thereon. FIG. 9C is a perspective view of the structure of FIG. 9B that illustrates how a flexible printed circuit board is mounted on top of the dielectric contact extensions. FIG. 9D is a perspective view of a communications insert of the jack 300, with the flexible printed circuit board omitted and half of the jackwire contact and dielectric contact extensions omitted as well. FIG. 9E is a perspective view of the jack 300. Finally, FIG. 9F is a side view of the jack 300.

As shown in FIGS. 9E and 9F, the jack 300 includes a dielectric housing 310 that includes a plug aperture 314 for receiving a mating plug. The dielectric housing 310 may be conventionally formed and need not be described in detail herein. It will also be appreciated that, when mounted, the jack 300 is typically rotated 180 degrees about its longitudinal axis from the orientation shown in FIGS. 9E and 9F so that the plug contacts 340 extend downwardly from the top of the plug aperture 314. In the discussion that follows, the relationship of the components of jack 300 with respect to each other will be described with respect to the orientation of FIG. 9E for convenience.

As shown in FIGS. 9D-9F, the jack 300 includes a communications insert 320. The communications insert 320 includes a spring holder 380, a flexible printed circuit board 330, an IDC substrate 322 and a plurality of plug contacts 340. The plug contacts 340 are implemented as low profile jackwire contacts 340. The communications insert 320 may be inserted into the back of the housing 310 so that the spring holder 380, a front portion of the flexible printed circuit board 330 and the plug contacts 340 extend into the plug aperture 314. In some embodiments, the IDC substrate 322 may comprise a printed circuit board, while in other embodiments the IDC substrate 322 may comprise one or more dielectric mounting substrates such as planar plastic pieces or any other suitable support structure. The communications insert 320 further includes a plurality of dielectric contact extensions 350, a plurality of springs 360 and a plurality of output contacts 370, each of which will be discussed in further detail below.

As shown in FIGS. 9A and 9E-9F, the spring holder 380 may comprise a dielectric frame 382 that extends forwardly from the IDC substrate 322. A plurality of channels 384 are provided in a center portion of the dielectric frame 382. The jack 300 includes a plurality of springs 360-1 through 360-8, and each of these springs 360 is positioned in a respective one of the channels 384. As will be discussed below, a separate spring 360 is provided for each jackwire contact 340, thereby allowing the jackwire contacts 340 to flex independent amounts in response to a mating plug being inserted into the plug aperture 314. Each spring 360 may be implemented as an elongated piece of resilient metal such as beryllium-copper or phosphor-bronze. As shown in FIG. 9B, each spring may have a first (front) end 362 and a second (rear) end 364. Each spring 360 may be received within a respective one of the channels 384 in the dielectric frame 382, where the spring 360 is held in proper position by the walls that define the channel 384 and by the dielectric contact extensions 350 (discussed below) that are provided on top of each spring 360. Consequently, neither the first end 362 nor the second end 364 need be fixed to the spring holder 380 or other structure. As will be discussed below, this arrangement allows each spring 360 to bow in the middle when a downward force is applied to the dielectric contact extension 350 that is positioned above the spring 360 (since both the first end 362 and the second end 364 can move inwardly in response to the force applied to a middle portion of the spring 360 by the dielectric contact extension 350). Thus, the entire body of the spring 360 may deform in response to a force applied thereto, which allows the spring 360 to absorb a much greater force per unit area without permanent deformation thereof as compared to a spring that has a fixed end such as, for example, a cantilevered spring. In the depicted embodiment, each spring 360 is implemented as a rectangular strip of beryllium-copper that is 26 mils wide, 540 mils long and 6 mils thick.

As is further shown in FIG. 9A, the spring holder 380 further includes a dielectric support 386. The dielectric support 386 is interposed between the springs 360 and the flexible printed circuit board 330 to better electrically isolate the flexible printed circuit board 330 from the springs 360. Finally, the spring holder 380 includes a rocker bar 388 that is mounted in a front portion of the dielectric frame 382. The function and operation of the rocker bar 388 will be described in detail below.

The flexible printed circuit board 330 may comprise an elongated printed circuit board that is formed of a flexible material that may be bent in various ways. As shown best in FIG. 9C, a front portion 332 of the flexible printed circuit board 330 is mounted above the springs 360 and may be disposed generally horizontally. A middle portion 334 of the flexible printed circuit board 330 then curves upwardly and extends in the vertical direction, and is rotates through a 180 degree turn so that a rear portion 336 of the flexible printed circuit board 330 may extend downwardly across the back opening of the housing 310.

The flexible printed circuit board 330 may include at least one dielectric layer that has conductive traces or other conductive elements mounted on either side thereof. In some embodiments, the flexible printed circuit board 330 may include a plurality of such dielectric layers. While the conductive traces and other conductive elements (e.g., capacitors) are not illustrated in the embodiment of FIGS. 9A-9F, it will be appreciated that these conductive traces/elements may form a plurality of conductive paths (not shown in the figures, but equivalent to the conductive paths 136-1 through 136-8 that are depicted in FIG. 30) that electrically connect each jackwire contact 340 to a respective one of the output contacts 370 as well as various elements that are provided for purposes of crosstalk compensation, return loss control, insertion loss control, etc.

As shown in, for example, FIGS. 9B-9F, eight low coupling jackwire contacts 340-1 through 340-8 are mounted in two rows on a top surface of the flexible printed circuit board 330. Each jackwire contact 340 has first and second ends (namely front and rear ends) that are mounted into and through the flexible printed circuit board 330, as well as a central plug contact region that is configured to physically engage a respective blade of a mating plug that is received within the plug aperture 314 of jack 300. One or both ends of each jackwire contact 340 may be electrically connected to conductive structures on the flexible printed circuit board 330. The jackwire contacts 340 may be formed of, for example, a resilient metal or a non-resilient metal such as copper of gold-plated copper. The middle portion of each jackwire contact 340 may be disposed at an oblique angle with respect to either or both the first and/or second ends of the jackwire contact 340. In the depicted embodiment, all of the jackwire contacts 340 have the same profile, although this need not be the case.

Each jackwire contacts 340 may also be staggered with respect to its adjacent jackwire contact(s) 340, as shown, such that the jackwire contacts 340 are aligned in two transverse rows. This stagger may readily be seen in, for example, FIGS. 9D and 9F. The jackwire contacts 340 may be designed so that they each engage the bottom, longitudinal surface of a mating plug blade. In contrast, the jackwire contacts of RJ-45 jacks conventionally are generally designed to engage the curved transition region of their respective blades of an RJ-45 plug when the plug is fully received within the plug aperture of the jack. As a result, even if the jackwire contacts have a degree of stagger when in their resting position, when the jackwire contacts are engaged by the blades of a mating plug, they tend to become aligned in a row as they each press against the curved transition region of their mating plug blades. By providing jackwire contacts 340 that engage the bottom, longitudinal surface of their mating plug blades, the stagger in the jackwire contacts 340 shown in FIGS. 9D and 9F may be maintained even when a plug is received within the plug aperture 314 of the jack 300.

Figure 2:
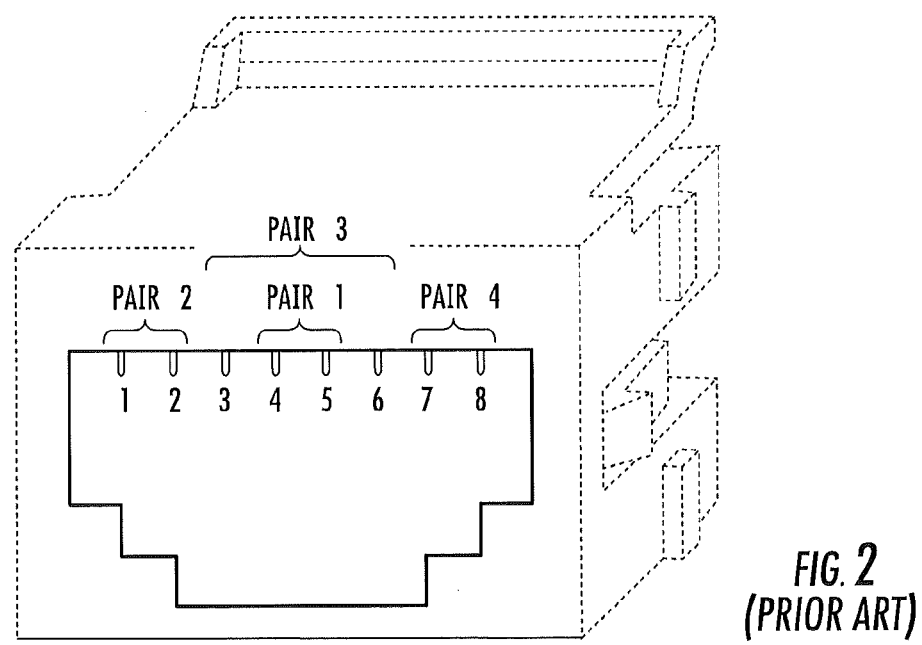
FIG. 2 is a schematic diagram illustrating the modular jack contact wiring assignments for a conventional 8-position communications jack (TIA 568B) as viewed from the front opening of the jack.

By configuring the jackwire contacts 340 in two staggered rows it is possible to reduce the amount of offending crosstalk that is generated between the differential pairs in the jack 300. By way of example, in a conventional RJ-45 jack illustrated in FIG. 2, in the plug-jack mating region jackwire contact 2 (which is part of pair 2) will generally couple a greater amount of signal energy onto jackwire contact 3 (which is part of pair 3) than will jackwire contact 1 (which is the other jackwire contact of pair 2), as jackwire contact 2 is directly adjacent to jackwire contact 3, while jackwire contact 1 is positioned farther away from jackwire contact 3. Consequently, this unequal coupling by the jackwire contacts of pair 2 onto pair 3 results in offending crosstalk from pair 2 onto pair 3 (and vice versa). In contrast, as shown in FIG. 9F, in the jack 300, jackwire contact 340-2 is staggered with respect to jackwire contacts 340-1 and 340-3 (since jackwire contact 340-2 is positioned forwardly in a first row while jackwire contacts 340-1 and 340-3 are positioned rearwardly in a second row). Thus, the amount of coupling between jackwire contact 340-2 and 340-3 can be reduced, thereby reducing the amount of unequal coupling from the jackwire contacts of pair 2 onto jackwire contact 340-3. Similar beneficial reductions in the amount of offending crosstalk may be achieved on each adjacent pair combination. Thus, the staggering of the jackwire contacts 340 into first and second rows may reduce the amount of offending crosstalk generated in the jack 300.

As is further shown in FIG. 9C, the flexible printed circuit board 330 includes a transverse slit 338-1, a plurality of longitudinal slits 338-2, and a pair of meandering slits 338-3. The transverse slit 338-1 extends transversely across the flexible printed circuit board 330 and, in this embodiment, cuts the flexible printed circuit board 330 into two separate pieces. While a single flexible printed circuit board 330 is used to manufacture the jack 300 that is then split into two pieces (namely a first piece that includes the forward portion of front section 332 and a second piece that includes the back portion of section 332 along with the middle and rear sections 334, 336 of flexible printed circuit board 330), it will be appreciated that in other embodiments two separate flexible printed circuit boards may be used. In still further embodiments, one of the two flexible printed circuit board pieces may be replaced with a conventional printed circuit board or a dielectric mounting substrate.

The slits 338 form a plurality of fingers 339-1 through 339-12 in the flexible printed circuit board 330. Herein, a "finger" on a substrate such as a flexible printed circuit board refers to a cantilevered portion of the substrate, regardless of the particular shape. A first end of each jackwire contact 340 is mounted on a first of the fingers 339 and the second end of each jackwire contact 340 is mounted on a second of the fingers 339. The fingers 339 allow each of the jackwire contacts 340 to move relatively independently with respect to the other jackwire contacts 340. For example, as shown in FIG. 9C, jackwire contact 340-7 is mounted on fingers 339-5 and 339-11. When a blade of a mating plug presses downwardly on jackwire contact 340-7, jackwire contact 340-7 may be deflected downwardly without deflecting adjacent jackwire contacts 340-6 or 340-8 downwardly. As discussed above, it may be advantageous to allow each jackwire contact 340 to move with some degree of independence with respect to other of the jackwire contacts 340 so as to ensure that each jackwire contact 340 will exert sufficient contact force against its mating plug blade as specified, for example, in applicable industry standards documents.

As shown in FIG. 9C, eight of the fingers 339 formed by the slits 338 are longitudinal fingers, namely fingers 339-1, 339-2, 339-5 through 339-8, 339-11 and 339-12. In contrast, the remaining four fingers 339-3, 339-4, 339-9, 339-10 each include a transverse component. While only two of the jackwire contacts 340 are depicted in FIG. 9C to more clearly show the slits 338 in the flexible printed circuit board 330, a plurality of ovals are included that show where the two ends of the remaining six jackwire contacts 340 would pierce the flexible printed circuit board 330. As these ovals make apparent, the ends of two different jackwire contacts 340 are mounted on each of the transversely extending fingers 339-3, 339-4, 339-9, 339-10. The transversely-extending fingers 339-3, 339-4, 339-9, 339-10 may facilitate injecting crosstalk compensation between the pairs at a relatively short delay from the plug contact point of each jackwire contact 340.

In particular, inductive crosstalk compensation may be provided in the jack 300 by inductive crosstalk compensation circuits that are implemented by routing the signal current carrying traces for two different conductive paths on the flexible printed circuit board 330 close to each other so that the traces inductively couple. Capacitive crosstalk compensation may be provided in the jack 300 by implementing capacitors on the flexible printed circuit board between various pairs of the conductive paths. In order to inject this inductive and capacitive crosstalk compensation at a relatively small delay, it is desirable to implement these crosstalk compensation circuits in the flexible printed circuit board 330 close to the jackwire contacts 340. However, as is apparent from FIG. 9C, the longitudinal slits 338-2 that are provided between various of the fingers 339 may be relatively long, and hence the conductive paths must be routed around these longitudinal slits 338-2 before the crosstalk compensation can be implemented. This can increase the delay, thereby degrading the effectiveness of the crosstalk compensation.

In order to inject crosstalk compensation at a shorter delay, fingers 339-3, 339-4, 339-9 and 339-10 are each transversely disposed fingers, and each of these fingers 339-3, 339-4, 339-9 and 339-10 has the ends of two different jackwire contacts 340 mounted thereon. In particular, finger 339-3 includes the front ends of jackwire contacts 340-3 and 340-5, finger 339-4 includes the front ends of plug contacts 340-4 and 340-6, finger 339-9 includes the rear ends of jackwire contacts 340-3 and 340-5, and finger 339-10 includes the rear ends of jackwire contacts 340-4 and 340-6. This arrangement may allow the inductive and capacitive crosstalk compensation circuits to be implemented closer to the jackwire contacts 340, thereby reducing the delay at which the inductive and capacitive crosstalk compensation is injected.

As shown in FIGS. 9B-9E, the jack 300 further includes eight dielectric contact extensions 350. In the depicted embodiment, each dielectric contact extension 350 comprises a flat, elongated piece of molded plastic. The eight dielectric contact extensions 350 each extend parallel to the longitudinal axis of the jack 300, and are aligned side-by-side in a row in the transverse direction. Each of the dielectric contact extensions 350 includes four transverse slots 352 (see FIG. 9B). Each of the jackwire contacts 340 is mounted in a respective one of the dielectric contact extensions 350, with the first end of each jackwire contact 340 being received in a first of the slots 352 and the second end of each jackwire contact 340 being received in a second of the slots 352. A total of four slots 352 are provided in each dielectric contact extension 350 so that all eight of the dielectric contact extensions 350 may be identical pieces (thus simplifying manufacturing) while providing dielectric contact extensions 350 that are suitable for holding jackwire contacts 340 that are in either of the two transverse rows of jackwire contacts 340. The first and second ends of each jackwire contact 340 may be press fit into its respective slot in its respective dielectric contact extension 350, or may be mounted in and/or secured to the dielectric contact extension 350 in any other appropriate manner. Each dielectric contact extension 350 may be mated with a respective one of the jackwire contacts 340 so that each dielectric contact extension 350 and its respective jackwire contact 340 move together as a single unit when a communications plug is inserted into the plug aperture 314 of jack 300 and engages the jackwire contacts 340. As shown in FIGS. 9C and 9E, the first and second ends of each jackwire contact 340 extend through the flexible printed circuit board 330 into their respective dielectric contact extensions 350 (note that the flexible printed circuit board is omitted from FIGS. 9B and 9D to better illustrate various features of the jack 300).

The forward end of each dielectric contact extension 350 includes an aperture. The rocker bar 388 passes through the aperture on all eight of the dielectric contact extensions 350 such that the front end of each dielectric contact extension 350 is mounted in the rocker bar 388. The bottom surface of each dielectric contact extension 350 rests on the top surface of a corresponding one of the springs 360. Thus, each spring 360 may be associated with a respective one of the jackwire contacts 340. Each spring 360 is configured to allow its respective jackwire contact 340 and associated dielectric contact extension 350 to resiliently deflect downwardly when the jackwire contact 340 is engaged by the blade of a mating plug that is received within the plug aperture 314. Each spring 360 is electrically isolated by one of the dielectric contact extensions 350 from its respective plug contact 340, and hence is not part of any of the signal current carrying paths through the jack 300.

When a mating plug is received within the plug aperture 314 of jack 300, the blades of this mating plug will push rearwardly and downwardly on the respective jackwire contacts 340. In response to these forces, each jackwire contact 340 will rotate downwardly as the dielectric contact extensions 350 rotate about the axis defined by the rocker bar 388. This downward rotational movement generally emulates the movement of a conventional jackwire contact that is cantilevered from the front to the rear of the plug aperture.

As discussed above, when a mating plug is received within the plug aperture 314 of jack 300, the blades of this mating plug will force the jackwire contacts 340 and the dielectric contact extensions 350 to rotate downwardly. When this occurs, the bottom of each dielectric contact extension 350 will press against the top surface of a central section of its respective spring 360. The middle portion of the each spring 360 will deflect or "bow" downwardly in response to this force, drawing both the first end 362 and the second end 364 of each spring 360 (which, as noted above, are not fixed) inwardly. As each spring 360 is resilient, it will exert an upward force on their respective dielectric contact extensions 350, thereby forcing each of the jackwire contacts 340 upwardly to ensure that each jackwire contact 340 engages its mating plug blade with sufficient contact force to ensure that a reliable electrical connection is maintained between the eight blades of the mating plug and the jackwire contacts 340 with which they respectively mate.

Since the entirety of each spring 360 may deform in response to a force being applied to the jackwire contacts 340, the springs 360 may absorb a considerable amount of force per unit area without undergoing permanent deformation. Thus, the use of a spring 360 that is not mounted on either end 362, 364 thereof may allow for the use of smaller springs 360 while still providing springs 360 that will resiliently deflect without undergoing permanent deformation. If cantilevered springs (either from the front or the back) were used instead of having the "free-floating" design shown in the figures, each spring would have to be nearly twice as long as shown in FIGS. 9A-9F in order to absorb the same amount of force without damage.

As shown best in FIGS. 9D and 9F, eight output terminals 370 in the form of IDCs are also mounted to be in electrical contact with the flexible printed circuit board 330. As shown best in FIG. 9F, in the pictured embodiment, the IDC substrate 322 comprises a pair of substrates 322-1, 322-2, and the rear portion 336 of the flexible printed circuit board 330 is received between the two substrates 322-1, 322-2. Each IDC 370 is mounted through the IDC substrate 322-2, then through the flexible printed circuit board 330 and finally into (and potentially through) the IDC substrate 322-1. In some embodiments, each IDC 370 is electrically connected to the flexible printed circuit board 330. In these embodiments, a signal that is transferred from a plug blade into the jack 300 will travel from the plug blade to a respective one of the jackwire contacts 340, from the jackwire contact 340 onto a conductive path across the flexible printed circuit board 330, and from the flexible printed circuit board to one of the IDCs 370 where the signal may be output from the jack 300.

In other embodiments, the IDC substrate 322 may comprise a conventional printed circuit board. Electrical connections may be provided between the flexible printed circuit board 330 and the conventional printed circuit board 322 so that each of the eight conductive paths on the flexible printed circuit board 330 connects to respective conductive paths on the conventional printed circuit board 322. In such embodiments, each IDC 370 may electrically connect to the flexible printed circuit board 330 through the conventional printed circuit board 322.

Figure 10:
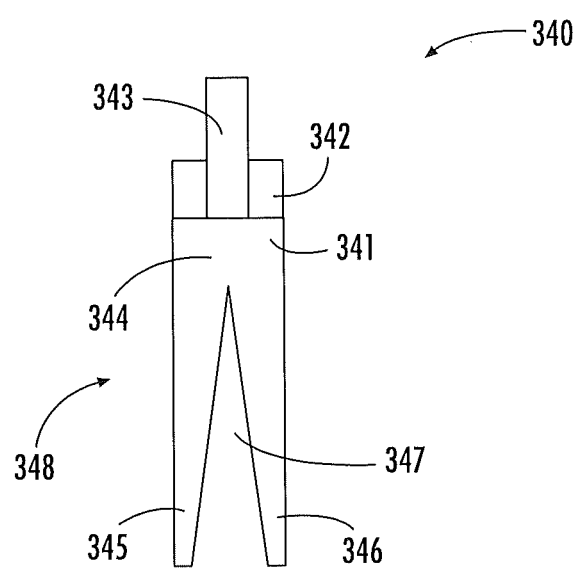
FIG. 10 is a schematic front view of a plug contact according to embodiments of the present invention.

FIG. 10 is a schematic front view of one of the jackwire contacts 340 that better illustrates an insulation piercing termination that is included on each end of each jackwire contact 340.

As shown in FIG. 10, the jackwire contact 340 includes a first (front) end 341, a second (rear) end 342 and a central plug contact region 343 that connect the front end 341 to the rear end 342. The front end 341 includes a widened section 344 that has first and second arms 345, 346 projecting downwardly therefrom. The arms 345, 346 define a channel 347 therebetween. The inner edges of arms 345, 346 may be sharpened in some embodiments, and the distal ends of arms 345, 346 may also be sharpened or formed as points. As discussed below, the arms 345, 346 and the channel 347 form a termination 348 that may, in some embodiments, be used to electrically connect the front end 341 of jackwire contact 340 to conductive structures on a flexible printed circuit board. The rear end 342 of each jackwire contact 340 may also be formed to have a termination 348.

Flexible printed circuit boards are available that have polyester dielectric layers or other dielectric materials that may be very flexible when heated. The points on the distal ends of arms 345, 346 of the termination 348 may be pressed through the flexible printed circuit board 330 and into a corresponding slot 352 on the dielectric contact extension 350 associated with the jackwire contact 340 at issue. The flexible printed circuit board 330 may include a conductive "wire" that is positioned to fall within the channel region 347 of the termination 348 when the front end 341 of jackwire contact 340 is punched through the flexible printed circuit board 330. This copper wire may comprise, for example, a heavy build-up of copper or another conductive material on one or more layers of the flexible printed circuit board 330. The inner edges of the arms 345, 346 of termination 348 may cut into and/or press against the conductive wire in the flexible printed circuit board 330 to establish a mechanical connection and an electrical connection between the jackwire contact 340 and the flexible printed circuit board 330 without the need for soldering, welding or the like. Thus, the use of terminations 348 on the jackwire contacts 340 may simplify the manufacturing process by eliminating any need for certain soldering or welding operations.

The communications jack 300 may exhibit improved performance as compared to many conventional communications jacks. As with the jack designs discussed above, the jack 300 may have very short jackwire contacts 340 since separate springs 360 are provided that are not part of the signal current carrying path. Consequently, the current path through each jackwire contact 340 may be shortened considerably as compared to conventional plug contacts, as it will run from approximately the middle of each jackwire contact 340 to the back end of each jackwire contact 340 that is mounted in the flexible printed circuit board 330. In some embodiments, the length of the current path through each of the jackwire contacts 340 may be on the order of about 80 mils to about 120 mils. As a result of this short current path, it is possible to inject either capacitive and/or inductive crosstalk compensation on the flexible printed circuit board 330 at a point that is very close in time to the plug-jack mating point, which may result in more effective crosstalk cancellation.

Additionally, in contrast to the jacks discussed above, in jack 300 both ends of each jackwire contact 340 are mounted in and through the flexible printed circuit board 330. Accordingly, capacitive crosstalk circuits may be attached between the front ends of various of the jackwire contacts 340. As the signal current carrying paths through the plug contacts do not pass through the fronts ends thereof, these capacitors will appear at a very small delay from the plug contact region of each jackwire contact 340. This may provide more effective crosstalk cancellation.

While embodiments of the present invention have primarily been discussed herein with respect to communications jacks that include eight conductive paths that are arranged as four differential pairs of conductive paths, it will be appreciated that the concepts described herein are equally applicable to jacks that include other numbers of differential pairs. It will also be appreciated that communications cables and connectors may sometimes include additional conductive paths that are used for other purposes such as, for example, providing intelligent patching capabilities. The concepts described herein are equally applicable for use with such communications cables and connectors, and the addition of one or more conductive paths for providing such intelligent patching capabilities or other functionality does not take such cables and connectors outside of the scope of the present invention or the claims appended hereto.

While the present invention has been described above primarily with reference to the accompanying drawings, it will be appreciated that the invention is not limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

As discussed above, embodiments of the present invention are directed to communications jacks. As used above, the terms "forward" and "front" and derivatives thereof refer to the direction defined by a vector extending from the center of the jack toward the plug aperture of the jack. Conversely, the term "rearward" and derivatives thereof refer to the direction directly opposite the forward direction. Together, the forward and rearward directions define the "longitudinal" dimension of the jack. The term "lateral" and derivatives thereof refer to the direction generally parallel with the line defined by the side of the plug aperture that includes a cutout for the latch of a mating plug and extending away from a plane that longitudinally bisects the center of the jack. A line normal to the longitudinal and transverse dimensions defines the "vertical" dimension of the jack.

Spatially relative terms, such as "under", "below", "lower", "over", "upper", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, operations, elements, and/or components, but do not preclude the presence or addition of one or more other features, operations, elements, components, and/or groups thereof.

Herein, reference is made to "input" contacts and "output" contacts. In the description above, the plug contacts of the jacks are typically referred to as "input contacts" and the IDCs (or other wire connection contacts) are typically referred to as "output contacts." However, it will be appreciated that whether a contact comprises an "input" contact or an "output" contact will depend on the direction of travel of the communications signal. For ease of description, herein the jack contacts that contact the plug blades have been consistently referred to as "input" contacts while the contacts that mate with the wires of a communications cable have been referred to as "output" contacts. However, it will be appreciated that if the direction of signal travel is reversed then the "output" contacts would become "input" contacts and the "input" contacts would act as "output" contacts. Thus, it will be appreciated that the terms "input" and "output" when used to describe the contacts of a jack have been used to distinguish the various contacts described herein from each other, but otherwise are not intended to limit a direction of signal travel or the like.

In the above description and the claims that follow, reference is made to certain elements that are "separate" from other elements. Two elements are considered to be "separate" from each other so long as they are distinct elements, even though the two pieces may be directly or indirectly connected to each other in the final product.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Herein, the terms "attached", "connected", "interconnected", "contacting", "mounted" and the like can mean either direct or indirect attachment or contact between elements, unless stated otherwise.

Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A communications jack, comprising:
a housing having a plug aperture in a front portion thereof;
a flexible printed circuit board having a plurality of conductive paths, the flexible printed circuit board being at least partly within the housing;
a plurality of input contacts that extend upwardly from the flexible printed circuit board and that are electrically connected to respective ones of the conductive paths on the flexible printed circuit board;
a plurality of output contacts that are electrically connected to respective ones of the conductive paths on the flexible printed circuit board; and
a spring that is separate from the input contacts and that biases at least a first of the input contacts, the spring being electrically isolated from the input contacts,
wherein each of the input contacts comprises a separate, raised contact that is fixed to the flexible printed circuit board,
wherein each of the input contacts includes a respective plug contact region that is within the plug aperture, and wherein signal current carrying paths from the plug contact regions of the respective input contacts to the flexible printed circuit board pass through portions of the respective input contacts that are fixed to the flexible printed circuit board.

2. The communications jack of claim 1, wherein a first of the input contacts extends forwardly beyond a front portion of the flexible printed circuit board.

3. The communications jack of claim 1, wherein a first of the input contacts is a substantially rigid input contact.

4. The communications jack of claim 1, further comprising a dielectric contact extension that is not part of the flexible printed circuit board that is directly connected to the first of the input contacts.

5. The communications jack of claim 4, wherein the dielectric contact extension is interposed between the first of the input contacts and the spring to connect the first of the input contacts to the spring.

6. The communications jack of claim 1, wherein the flexible printed circuit board includes a plurality of cantilevered fingers.

7. The communications jack of claim 6, wherein each of the input contacts is mounted on a respective one of the cantilevered fingers.

8. The communications jack of claim 1, wherein portions of the input contacts that include the plug contact regions extend upwardly from a first side of the flexible printed circuit board and the spring is on a second side of the flexible printed circuit board that is opposite the first side.

9. The communications jack of claim 1, wherein each input contact has a first end and a second end, and wherein both the first end and the second end of at least some of the input contacts are fixedly attached to the flexible printed circuit board.

10. The communications jack of claim 1, wherein the flexible printed circuit board include a plurality of openings, and wherein each of the input contacts has a base that is mounted through a respective one of the openings.

11. The communications jack of claim 1, wherein the first end portion of each input contact has a piercing termination that extends through the flexible printed circuit board and that electrically connects the respective input contacts to respective ones of a plurality of conductive paths on the flexible printed circuit board.

12. A communications jack, comprising:
a housing having a plug aperture;
a plurality of input contacts that extend into the plug aperture;
a flexible printed circuit board that includes a plurality of cantilevered fingers; and
a plurality of springs that bias the respective input contacts, wherein each spring is electrically isolated from the respective input contact that it biases;
wherein a base of each of the input contacts extends through a respective aperture in the flexible printed circuit board into respective dielectric mounting structures that are below the flexible printed circuit board, and wherein a plug contact region of each input contact extends above the flexible printed circuit board.

13. The communications jack of claim 12, wherein each of the input contacts is substantially rigid.

14. The communications jack of claim 12, wherein the plurality of springs are below of the flexible printed circuit board.

15. The communications jack of claim 12, wherein each input contact comprises a non-resilient metal.

16. A communications jack, comprising:
a flexible printed circuit board;
a plurality of jackwire contacts that are each electrically connected to the flexible printed circuit board and that are mounted to extend above a top surface of the flexible printed circuit board;
wherein the jackwire contacts have respective first end portions that are attached to the flexible printed circuit board at respective first mounting locations on the flexible printed circuit board and at least some of the jackwire contacts have second end portions that are attached to the flexible printed circuit board at respective second mounting locations on the flexible printed circuit board, and
wherein a signal current carrying path for each of the jackwire contacts passes through the respective first mounting location for each of the jackwire contacts.

17. The communications jack of claim 16, further comprising a plurality of dielectric contact extensions, wherein each jackwire contact is mounted in a respective one of the dielectric contact extensions and wherein the dielectric contact extensions are positioned below the flexible printed circuit board, and wherein each jackwire contact includes a plug contact region that extends above the flexible printed circuit board and wherein the first end portion of each jackwire contact extends through the flexible printed circuit board into a respective one of the dielectric contact extensions.

18. The communications jack of claim 16, wherein the flexible printed circuit board includes a plurality of cantilevered fingers.

19. The communications jack of claim 16, wherein the flexible printed circuit board comprises a first flexible printed circuit board and a second flexible printed circuit board, and wherein the first mounting locations are on the first flexible printed circuit board and the second mounting locations are on the second flexible printed circuit board.

* * * * *